United States Patent [19]
Ohki

[11] Patent Number: 5,418,907
[45] Date of Patent: May 23, 1995

[54] MULTI-PORT MEMORY AND DIGITAL INTERPOLATION APPARATUS

[75] Inventor: Mitsuharu Ohki, Tokyo, Japan

[73] Assignee: Sony Corporation, Tokyo, Japan

[21] Appl. No.: 939,442

[22] Filed: Sep. 2, 1992

[30] Foreign Application Priority Data

Sep. 12, 1991 [JP]  Japan ............................ 3-261169
Sep. 20, 1991 [JP]  Japan ............................ 3-269049

[51] Int. Cl.⁶ ............................................. G06F 3/14
[52] U.S. Cl. ............................................. 395/166
[58] Field of Search ............. 395/162, 163, 164, 165, 395/166; 345/189, 190, 191; 364/710.14, 723

[56] References Cited

U.S. PATENT DOCUMENTS

4,931,954  6/1990  Honda et al. ..................... 395/128

FOREIGN PATENT DOCUMENTS

0270028A2  6/1988  European Pat. Off. ....... G11C 8/00
0276870A2  8/1988  European Pat. Off. ....... G11C 8/00
1573661    8/1980  United Kingdom ......... H03K 17/00
2117942A   10/1983 United Kingdom ......... G11C 8/00

*Primary Examiner*—Phu K. Nguyen
*Attorney, Agent, or Firm*—Charles P. Sammut; Limbach & Limbach

[57] ABSTRACT

A multi-port memory with a memory array having a plurality of memory cells arranged in a matrix fashion. The memory array includes first signal lines for selecting rows of the plurality of memory cells. The memory array further includes second signal lines for selecting columns of the plurality of memory cells. The multi-port memory further includes a first decoder for generating select signals for selecting the first signal lines. The multi-port memory further includes a plurality of input or output ports connected to the second signal lines. The multi-port memory further includes a second decoder for use in common for the plurality of input/output ports and for generating select signals for selecting the second signal lines, wherein the select signals for selecting second signal lines to connect to the plurality of input/output ports the second signal lines are shifted one by one, respectively. The multi-port memory may be used with an interpolation circuit in a digital interpolation apparatus.

17 Claims, 24 Drawing Sheets a0,0 a0,1 a0,2 ... a0,14
a1,0 a1,1 a1,2
b0 b1 b2 b3     b8 b9 b10 b11
b4 b5 b6 b7
a4,0 ... a4,14

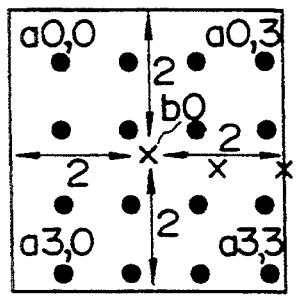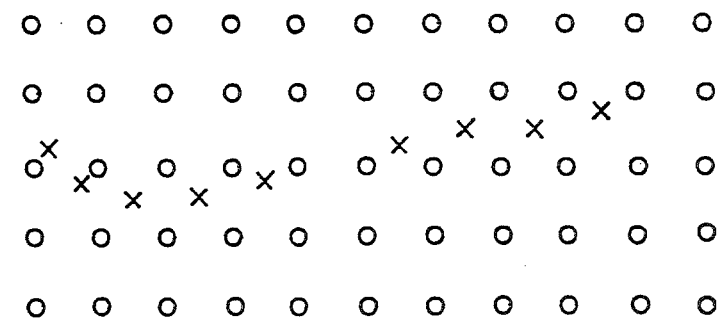
Fig. 10
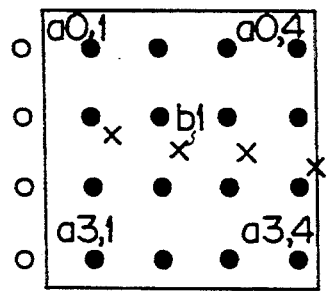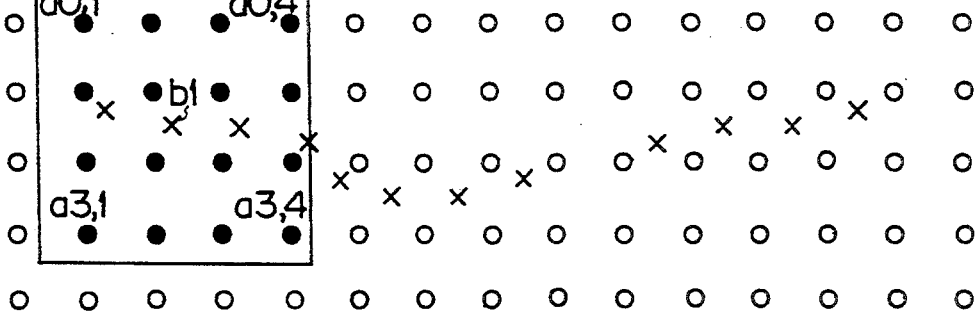
Fig. 11
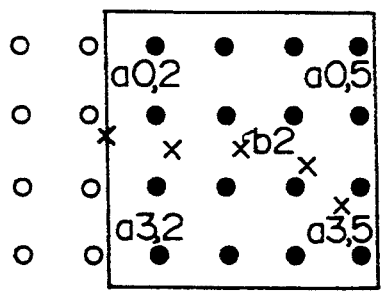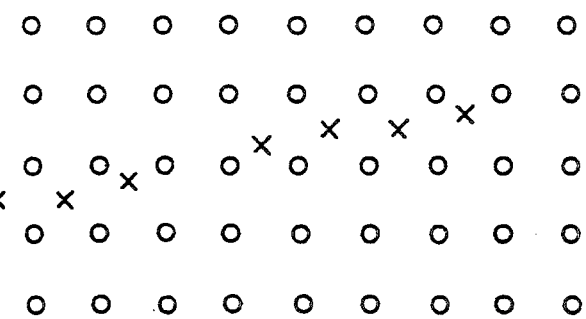
Fig. 12

MULTI-PORT MEMORY AND DIGITAL INTERPOLATION APPARATUS

BACKGROUND OF THE INVENTION

1. Field of the Invention

The present invention relates to a multi-port memory where a plurality of serial ports are led from one semiconductor memory array and a digital interpolation apparatus for compensating distortion of, for example, image data by the use of the multi-port memory.

2. Description of the Prior Art

There is known semiconductor memory array which has a plurality of memory cells arranged in a matrix fashion. In this memory array there are word lines for selecting memory cells in row direction and bit lines for selecting memory cells in column direction. A row decoder generates a select signal for use in selecting word lines and a column decoder generates a select signal for use in selecting bit lines. For example, by decoding a high order bit of an address, a word select signal is generated. On the other hand, by decoding the low order bit of the address, a bit select signal is generated.

In this memory array, by connecting a plurality of input/output ports to the bit lines and by providing a column decoder for designating a bit line accessed on each port, a multi-port memory can be constructed.

In the multi-port memory, to independently designate rows and set the speed of output data, numbers of control circuits and column decoders which are equal to the number of the output ports are required and thereby the circuit scale is increased. In the case of the processing of audio signals or video signals, there are relatively few processes which need a plurality of data being independent. On the other hand, there are relatively many processes of calculating the data adjoined periodically or spatially. For example, in a digital filter, the inner product of a plurality of data which are periodically continuous is calculated. Thus, when audio signals or video signals are processed, a memory which can access adjacent data through a plurality of input or output ports is required.

On the other hand, since a picture photographed with a fisheye lens tends to have a distortion, image pick-up signals are converted into digital signals so as to compensate the distortion by the use of digital signal processing. Further, the unintentional movement of a hand in taking a picture with a video camera is also compensated by the use of digital signal processing. The compensation for the unitentional movement of a hand is a process which detects a motion vector generated by the hand movement and moves the picture frame by the amount of the motion vector. When the picture frame is moved, since there is a region which does not contain a picture, the picture should be enlarged in advance. Besides the compensation for the movement of a hand, the picture is occasionally enlarged by a special effect generator and so forth. In addition, sometimes the picture should be reduced. In the case where the distortion of a picture is compensated or in the case where a picture is enlarged or reduced, data which is interpolated from the original picture data is generated.

As described above, in the digital processing on a picture, the interpolation apparatus is used for a variety of applications. The interpolation apparatus multiplies a plurality of adjacent picture data by weighting coefficients and adds the result of the multiplication. Conventionally, in one cycle for accessing a memory which stores picture data by a circuit for performing interpolation calculations, only one data could be processed at a time, and the interpolation process could not be performed on a real time basis. In other words, if a plurality of pixel data could be sent to the interpolation circuit at a time in one cycle, the speed of the interpolation process could be increased.

OBJECTS AND SUMMARY OF THE INVENTION

Therefore, an object of the present invention is to provide a multi-port memory suitable for processing audio signals or video signals in a circuit which is relatively small.

Another object of the present invention is to provide a digital interpolation apparatus which can send a plurality of pixel data at a time to an interpolation circuit and perform interpolation calculations at a high speed by the use of a multi-port memory having a plurality of output ports.

Still another object of the present invention is to provide a digital interpolation apparatus which can interpolate audio signals or video signals by the use of a multi-port memory whose circuit scale is relatively small.

According to an aspect of the present invention, there is provided a multi-port memory which includes a memory array with a plurality of memory cells arranged in a matrix fashion. This memory array includes first signal lines for selecting rows of the plurality of memory cells and second signal lines for selecting columns of the plurality of memory cells. The multi-port memory further includes a first decoder for generating select signals for selecting the first signal lines. The multi-port memory further includes a plurality of input/output ports connected to the second signal lines. The multi-port memory further includes a second decoder for use in common for the plurality of input/output ports and for generating select signals for selecting the second signal lines. In this multi-port memory, the select signals select second signal lines to connect to the plurality of input-/output ports. The second signal lines which are shifted one by one, respectively. Note that arrangements in which signal lines are shifted one by one will be described below in the Detailed Description of the Preferred Embodiments, below.

According to another aspect of the present invention, there is provided a digital interpolation apparatus which includes a memory array having a plurality of memory cells arranged in a matrix fashion. The memory array includes first signal lines for selecting rows of the plurality of memory cells and second signal lines for selecting columns of the plurality of memory cells. The digital interpolation apparatus further includes a first decoder for generating select signals for selecting the first signal lines. The digital interpolation apparatus further includes a plurality of output ports connected to the second signal lines. The digital interpolation apparatus further includes a second decoder for use in common for the plurality of output ports and for generating select signals for selecting the second signal lines. The digital interpolation apparatus further includes an interpolation circuit for receiving read data of the memory array from the plurality of output ports. In this digital interpolation apparatus, select signals select the second signal lines connect to the plurality of output ports. The second signal lines which are shifted one by one. In this digital interpolation circuit, the interpolation circuit performs interpolation calculations for a plurality of adjacent data supplied from the plurality of output ports so as to generate output data.

The above, and other, objects, features and advantages of the present invention will become readily apparent from the following detailed description thereof which is to be read in connection with the accompanying drawings.

BRIEF DESCRIPTION OF THE DRAWINGS

FIG. 10 a schematic diagram showing the region of pixel data necessary for generating an interpolation output b0;

FIG. 11 is a schematic diagram showing the region of pixel data necessary for generating an interpolation output b1;

FIG. 12 is a schematic diagram showing the region of pixel data necessary for generating an interpolation output b2;

DETAILED DESCRIPTION OF THE PREFERRED EMBODIMENTS

Figure 1:
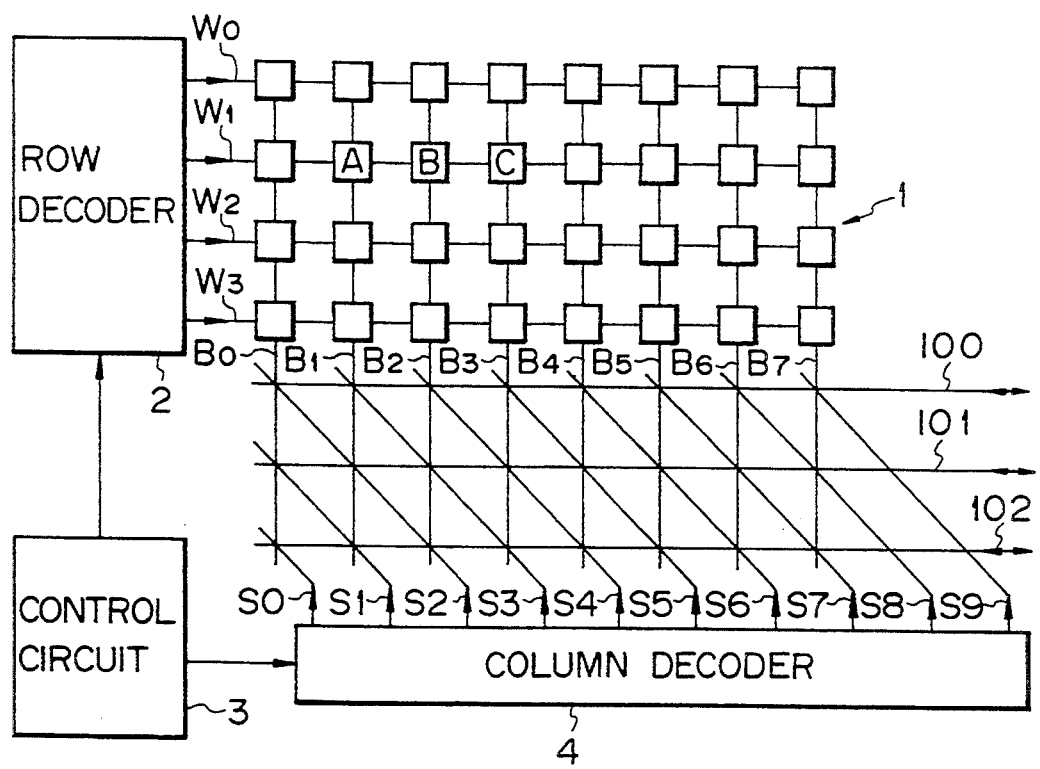
FIG. 1 is a block diagram of an embodiment of a multi-port memory according to the present invention.

An embodiment of a multi-port memory according to the present invention will be described with reference to the accompanying drawings. In FIG. 1, reference numeral 1 denotes a semiconductor memory array having memory cells arranged in a matrix fashion. In this embodiment, as a simple example, the memory array 1 is constructed of 4 rows×8 columns of memory cells. Word lines W0, W1, W2, and W3 for selecting each row of the memory array 1 and bit lines B0, B1, . . . , and B7 for selecting each column of the memory array 1 are provided. Three input/output lines IO0, IO1, and IO2 are connected to the bit lines B0 to B7 in parallel. In FIG. 1, and other figures described below, sense amplifiers and/or strong buffers which can be connected to positions where a heavy load is applied, for instance, word lines are not shown.

A select signal from a row decoder 2 is selectively supplied to the word lines W0 to W3. Thereby, one of the word lines W0 to W3 (rows) is selected. A control signal from a control circuit 3 is supplied to the row decoder 2. The control circuit 3 is also connected to a column decoder 4. For example, a high order bit of an address is supplied to the row decoder 2 from the control circuit 3. In addition, the low order bit of the address is supplied to a column decoder 4 from the control circuit 3.

The select signal from the row decoder 2 selects one row. On the other hand, the select signals S0 to S9 from the column decoder 4 are fed to a plurality of bit lines. In other words, the select signal S0 is sent to the bit line B0, and the select signal S1 is sent to the bit lines B0 and B1. The select signal S2 is sent to the bit lines B0, B1, and B2, and the select signal S3 is sent to the bit lines B1, B2, and B3. Likewise, the select signals are sent to the bit lines in such a way that the bit lines are shifted one by one.

Figure 2A:
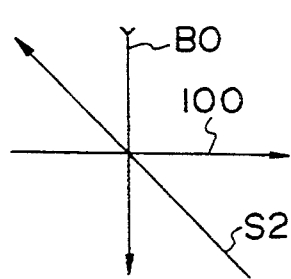
FIGS. 2A and 2B are schematic diagrams describing connections of bit lines, input/output lines, and lines for supplying select signals.
Figure 2B:
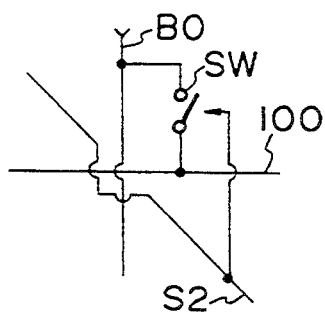

FIG. 1 represents a simplified schematic where for example, the bit line B0 is perpendicularly intersected with the input/output line IO0 and the line for supplying the select signal S2 is obliquely crossed with the point of intersection as shown in FIGS. 1 and 2A. As shown in FIG. 2B, a switching device SW is disposed between the bit line B0 and the input/output line IO0 and the switching device SW can be turned on by the select signal S2. When the switching device SW is turned on, the bit line B0 is connected to the input/output line IO0.

As an example, when the row decoder 2 outputs the select signal which selects the word line W1, eight memory cells connected to the word line W1 are designated. In addition, when the column decoder 4 causes the select signal S3, which selects the column lines B1, B2, and B3 to become active, the memory cells denoted with A, B, and C in FIG. 1 are accessed. Thus, data can be written to or read out from the memory cells A, B, and C through the input/output lines IO0, IO1, and IO2. When the memory array 1 accords with spatial arrangement of video signals and each cell stores data of one sample, a plurality of adjacent pixel data can be accessed at the same time.

Figure 3:
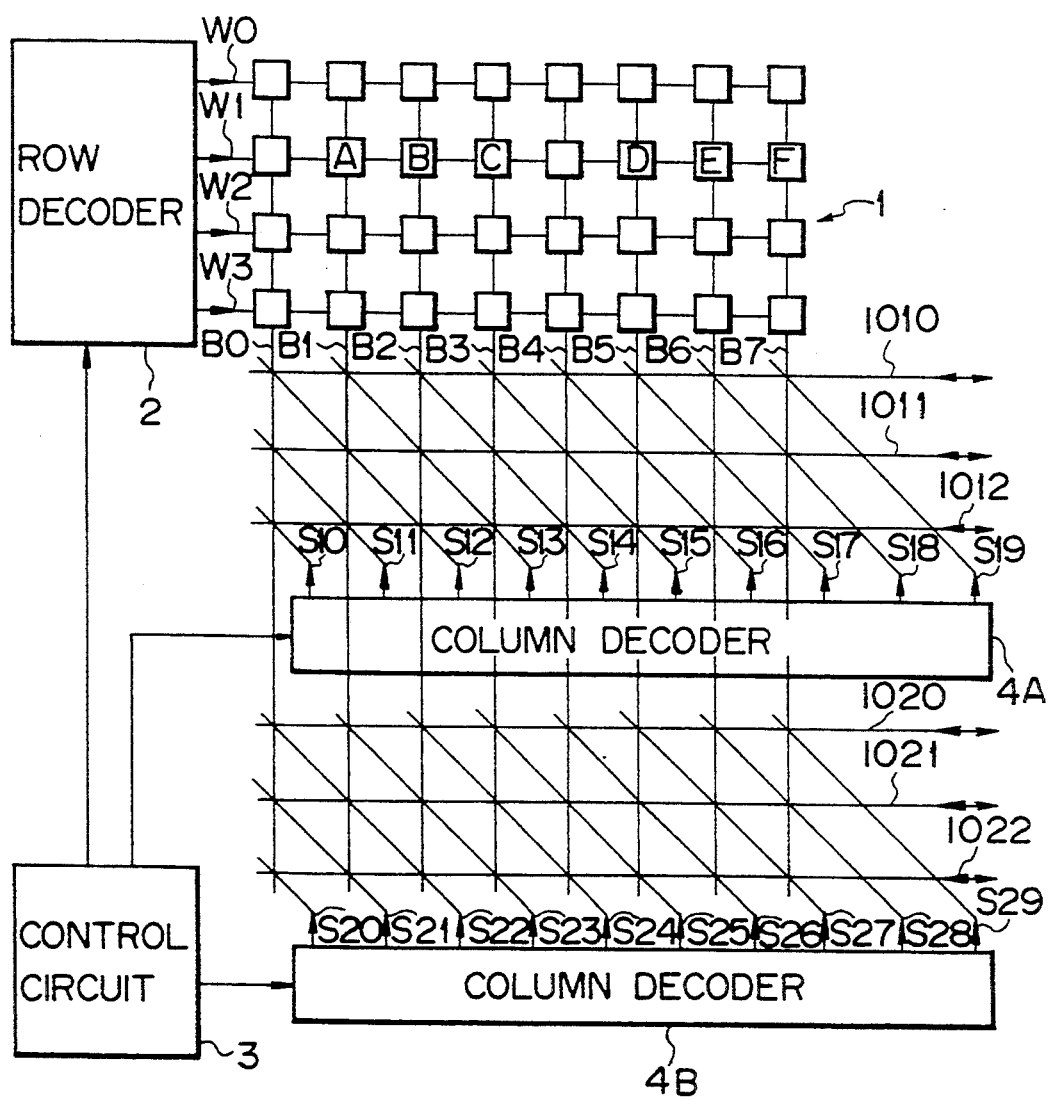
FIG. 3 is a block diagram of a second embodiment of multi-port memory according to the present invention.

FIG. 3 shows another embodiment of a multi-port memory of the present invention. Like the example of FIG. 1, there is provided a memory array 1 which includes word lines W0 to W3 and bit lines B0 to B7. In addition, there is also provided a row decoder 2 for selecting word lines. In FIG. 3, three input/output lines IO10, IO11, and IO12 are connected to the bit lines B0 to B7 in parallel. Moreover, three more input/output lines IO20, IO21, and IO22 are connected to the bit lines B0 to B7 in parallel. At each point of intersection of the bit lines B0 to B7 and the input/output lines IO10, IO11, and IO12, like FIG. 2B, a switching device which selectively connects these lines is connected, respectively. In addition, at each point of intersection between the bit lines B0 to B7 and the input/output lines IO20, IO21, and IO22, a switching device which selectively connects these lines is connected, respectively.

The row decoder 2 and two column decoders 4A and 4B are connected to a control circuit 3. Select signals S10, S11, . . . , and S19 are supplied from the column decoder 4A to the switching devices where the bit lines B0 to B7 are intersected with the input/output lines IO10, IO11, and IO12 in such a way that the bit lines are shifted one by one. In addition, likewise, the select signals S20, S21, . . . , S29 are supplied from the column decoder 4B to the switching devices where the bit lines B0 to B7 are intersected with the input/output lines IO20, IO21, and IO22.

As shown in FIG. 3, by independently providing the two column decoders 4A and 4B, when a word line, for example, W1 is selected, the memory cells A, B, C, D, E, and F in FIG. 3 can be accessed by causing select signals S13 and S27 to become active.

Figure 4:
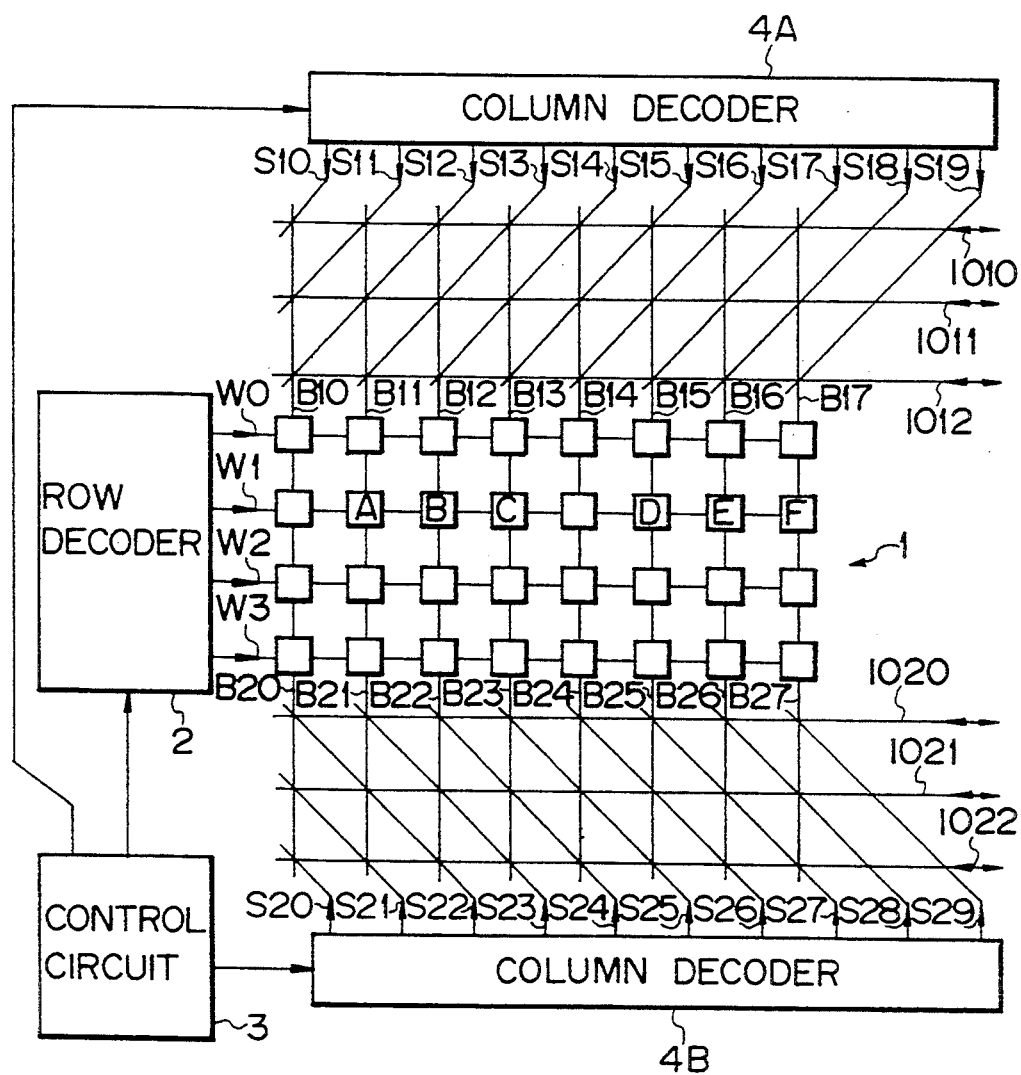
FIG. 4 is a block diagram of a third embodiment of a multi-port memory according to the present invention.

FIG. 4 shows still another embodiment of a multi-port memory of the present invention. In FIG. 4, like the example of FIG. 3, there are provided six input/output lines IO10 to IO22. However, the layout of FIG. 4 is different from that of FIG. 3. Bit lines B10 to B17 and bit lines B20 to B27 are led from the memory array 1, respectively, and column decoders 4A and 4B are provided at the upper and lower positions (positions in the drawing). The bit lines B10 to B17 are selected by the select signals S10 to S19 from the column decoder 4A. The bit lines B20 to B27 are selected by the select signals S20 to S29 from the column decoder 4B.

Figure 5:
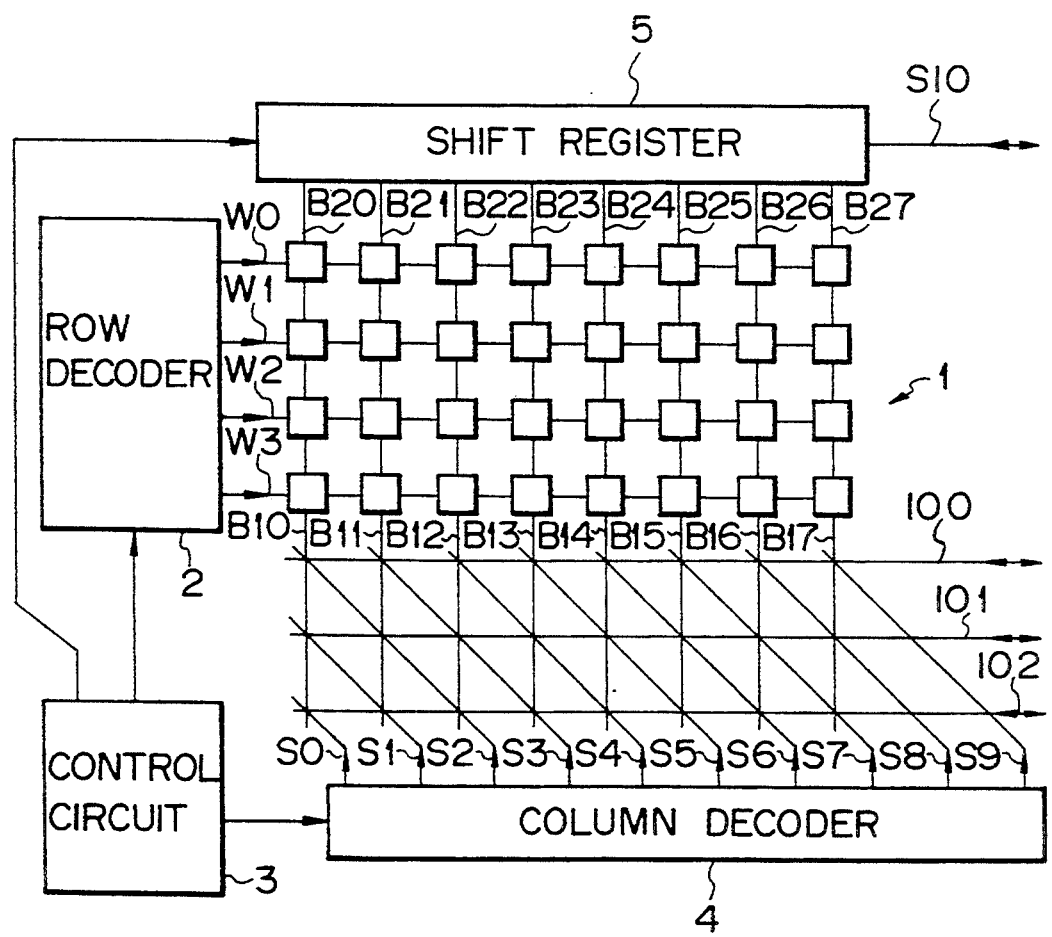
FIG. 5 is a block diagram of a fourth embodiment of a multi-port memory according to the present invention.

FIG. 5 shows yet another embodiment of a multi-port memory of the present invention. As shown in FIG. 5, the input/output lines IO0, IO1, and IO2 are connected to the memory array 1. Bit lines B10 to B17 are accessed by select signals S0 to S9. In addition, there is also provided a shift register 5. A serial input/output lines SIO is led from the shift register 5. A control signal is supplied to the shift register 5 from the control circuit 3. Eight memory cells on one word line of the memory array 1 are connected to the shift register 5 in parallel. In addition, data is input/output to the shift register 5 through the serial input/output line SIO. For example, a word line W1 is selected and the contents of the eight memory cells on the word line W1 are loaded to the shift register 5 in parallel. Data of each memory cell is serially output from the serial register 5 to the serial input/output line SIO. The example of FIG. 5 is suitable for video signals in raster scanning sequence.

Further, there can be provided a plurality of shift registers for bit lines B20 to B27 so as to provide a plurality of serial ports. Thus, a multi-port memory having a plurality of serial ports can be constructed. The plurality of serial ports can independently designate rows of memory array and data of rows can be serially output by independent clocks.

Figure 6:
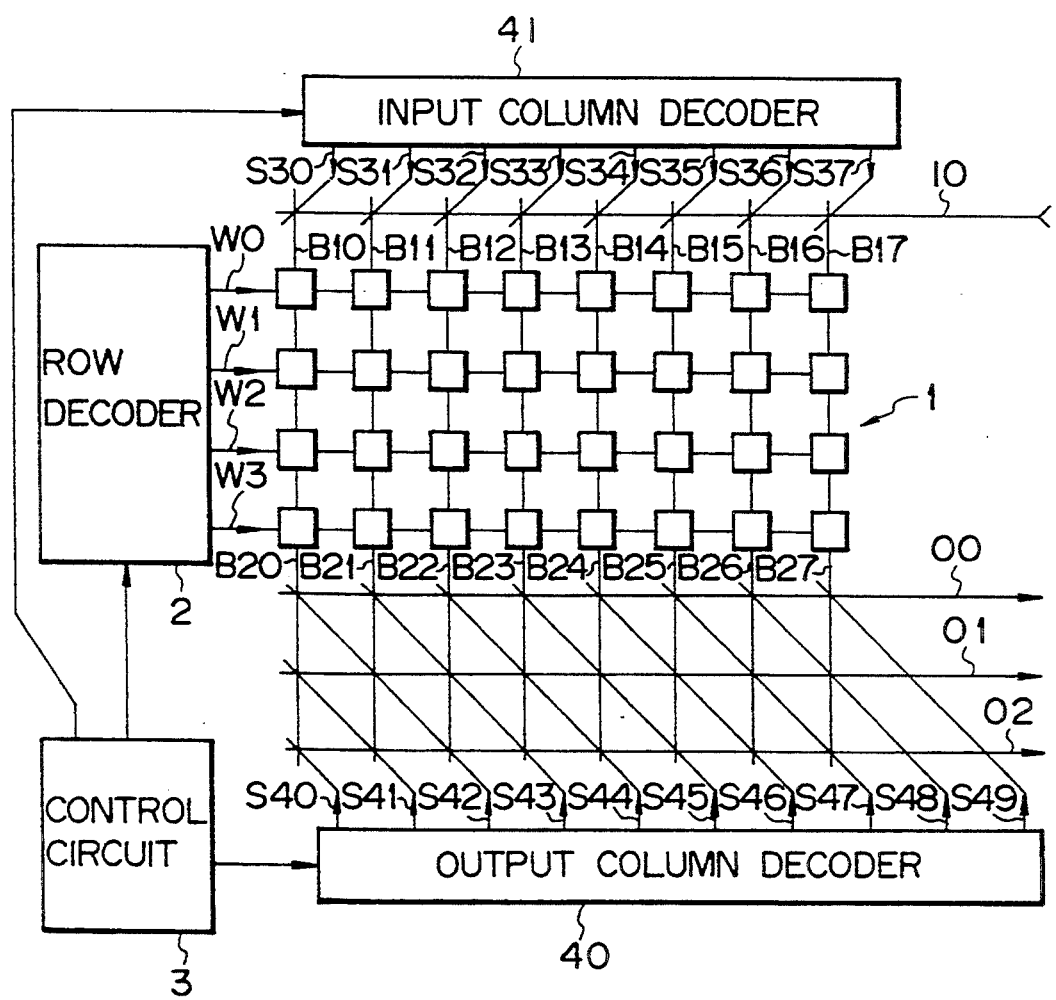
FIG. 6 is a block diagram of a further embodiment having an input column decoder and an output column decoder which are separately disposed.

In the above mentioned embodiments, the input ports and the output ports were commonly used. However, it should be appreciated that these ports can be independently provided. As shown in FIG. 6, one input line I0 is connected to bit lines B10 to B17 of a memory array 1, while three output lines O0, O1, and O2 are connected to bit lines B20 to B27. An input column decoder 4I and an output column decoder 4O are connected with the control circuit 3. The column decoder 4I generates select signals S30 to S37 for selecting one of input bit lines. Like the above described embodiments, select signals S40 to S49 that the column decoder 4O generates are sent to bit lines B20 to B27, respectively in such a way that these bit lines are shifted one by one. With these select signals S40 to S49, three memory cells are accessed.

Figure 7:
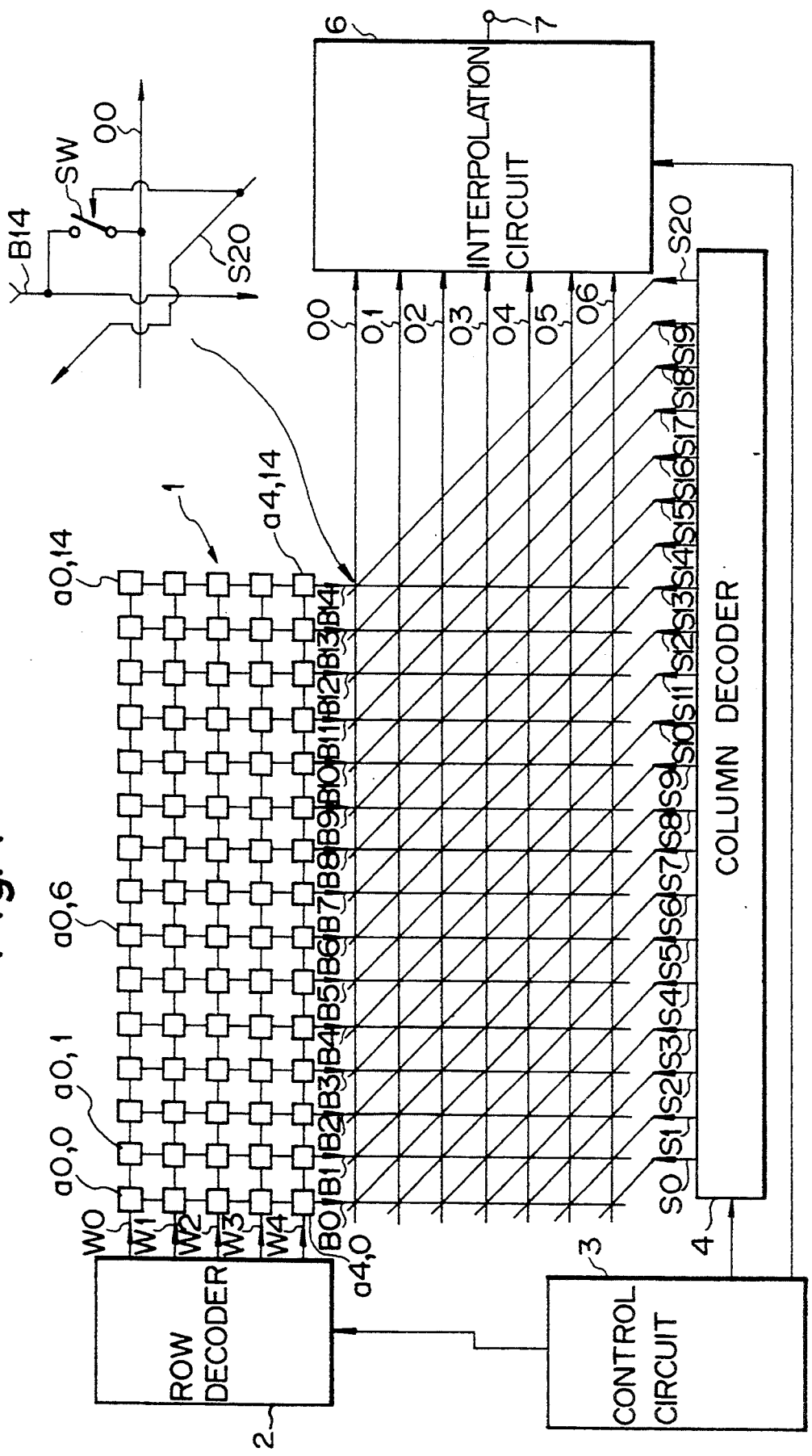
FIG. 7 is a block diagram of an embodiment of a digital interpolation apparatus according to the present invention.

Embodiments of a digital interpolation apparatus according to the present invention will now be described with reference to the accompanying drawings. FIG. 7 is a block diagram of an embodiment of a digital interpolation apparatus according to the present invention. In FIG. 7, reference numeral 1 denotes a semiconductor memory array where memory cells are arranged in a matrix fashion. In this embodiment, the memory array 1 is constructed of 5 rows × 15 columns of memory cells. To select each row of the memory array 1, word lines W0, W1, W2, W3, W4, and are led therefrom. On the other hand, to select each column of the memory array 1, bit lines B0, B1, . . . , and B14 are led therefrom. Seven output lines O0, O1, ..., and O6 are connected to the bit lines B0 to B14 in parallel. In FIG. 7, sense amplifiers and/or strong buffers (which are connected to positions where a heavy load is applied), and so forth are not shown. Each row of the memory array 1 represents the line direction of a video signal. Pixel data (for one sample) is written to each memory cell. The description of the data write scheme is omitted for simplicity. In brief, video data is written to the memory array 1 through input ports which are provided discretely or in common with output ports.

Select signals from a row decoder 2 are selectively supplied to the word lines W0 to W4. Thus, one of word lines W0 to W4 (rows) is selected. On the other hand, a control signal from a control unit 3 is supplied to the row decoder 2. The control circuit 3 is also connected to a column decoder 4. The control unit 3 sends a high order bit of an address to the row decoder 2, while the control unit 3 sends a low order bit of the address to the column decoder 4.

The select signal from the row decoder 2 selects one of rows. On the other hand, the select signals S0 to S20 from the column decoder 4 are sent to a plurality of bit lines. In other words, the select signal S0 is sent to the bit line B0; the select signal S1 is sent to the bit lines B0 and B1; the select signal S2 is sent to the bit lines B0, B1, and B2; the select signal S3 is sent to the bit lines B0, B1, B2, and B4. Thereafter, the select signals are sent to the bit lines in a like manner that the bit lines are shifted one by one.

FIG. 7 represents a simple schematic where for example the bit line B14 is perpendicularly intersected with the output line O0 and the line for supplying the select signal S20 is obliquely crossed with the point of intersection. As shown by the enlarged view in FIG. 7, a switching device SW is disposed between the bit line B14 and the output line O0. The switching device SW can be turned on by the select signal S20. When the switching device SW is turned on, the bit line B14 and the output line O0 are connected and the data of the memory cell connected to the bit line B14 can be read to the output line O0.

Each pixel data stored in each memory cell of (5×15) matrix is denoted with ai,j (where i=0, 1, 2, 3, and 4; j=0, 1, 2, ..., and 14). As an example, when the row decoder 2 outputs the select signal which selects the word line W0, 15 memory cells connected to the word line W0 are designated. In addition, when the column decoder 4 causes the select signal S6, which selects the column lines B0, B1, ..., and B6, to become active, the memory cells of the first column to the seventh column of the first row are accessed. Thus, pixel data of a0,0, a0,1, ..., and a0,6 are read from these memory cells to the output lines O0 to O6. In other words, the seven successive pixel data a0,0 to a0,6 of the same row can be read at the same time.

The output lines O0 to O6 are connected to a plurality of input terminals of an interpolation circuit 6. The interpolation circuit 6 multiplies the seven pixel data by weighting coefficients corresponding to the positions of the pixel data and then adds the multiplication outputs. Thus, the interpolation circuit 6 generates the resultant interpolation data at an output terminal 7. The interpolation circuit 6 receives from the control circuit 3 a control signal which controls the timing of the interpolation calculations.

Figures 8, 9:
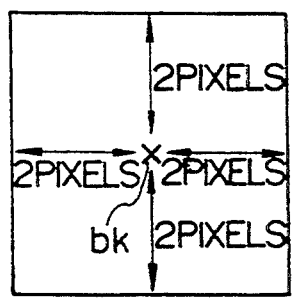
FIG. 8 is a schematic diagram describing an interpolation process to which the present invention is applicable.
FIG. 9 is a schematic diagram showing the region of pixel data necessary for the interpolation process.
Figure 13:
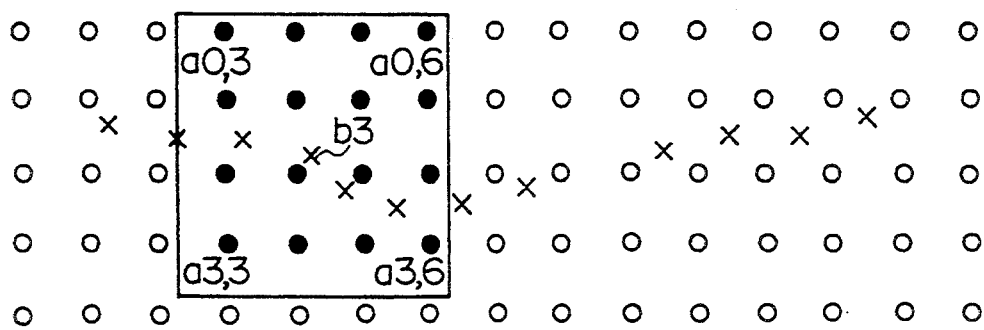
FIG. 13 is a schematic diagram showing the region of pixel data necessary for generating an interpolation output b3.
Figure 14:
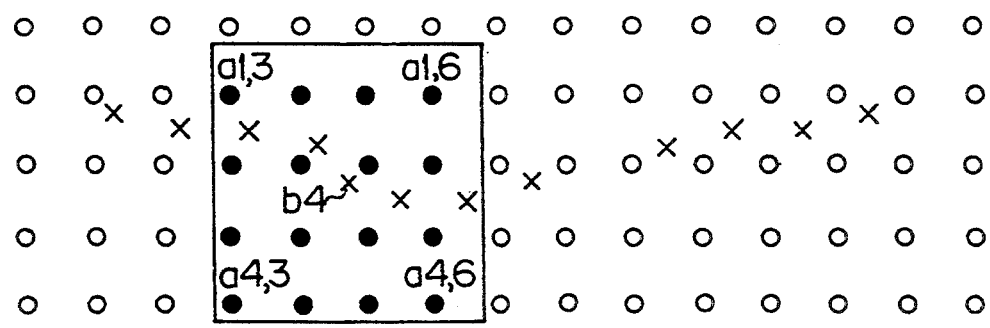
FIG. 14 is a schematic diagram showing the region of pixel data necessary for generating an interpolation output b4.
Figure 15:
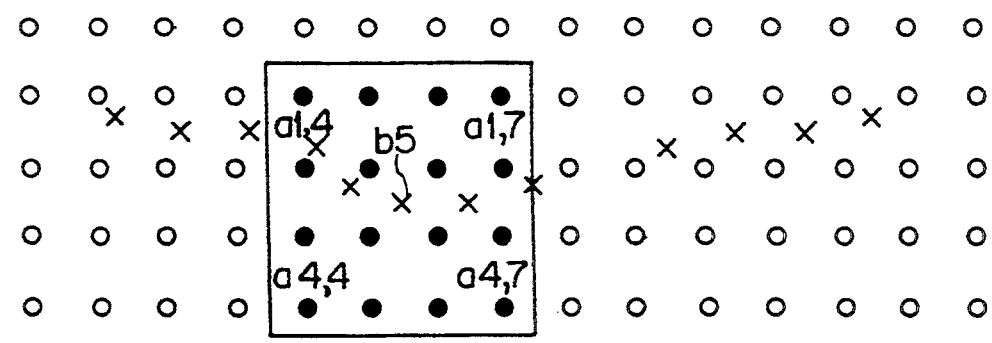
FIG. 15 is a schematic diagram showing the region of pixel data necessary for generating an interpolation output b5.
Figure 16:
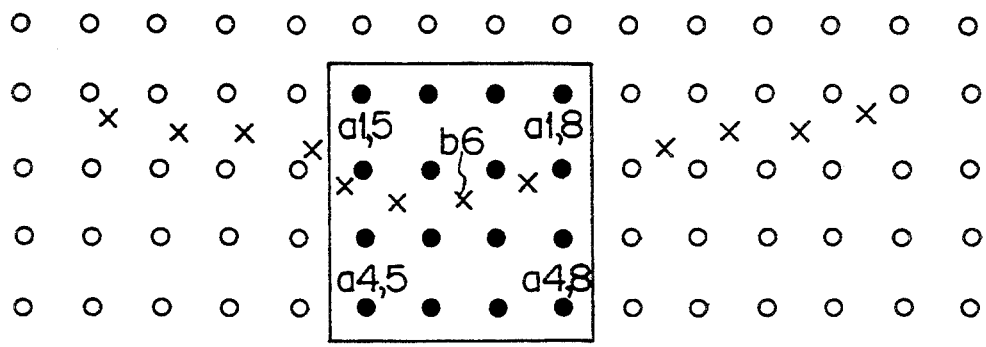
FIG. 16 is a schematic diagram showing the region of pixel data necessary for generating an interpolation output b6.
Figure 17:
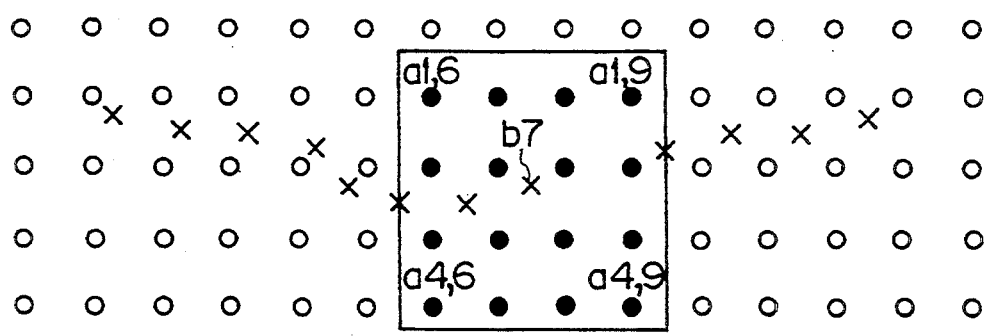
FIG. 17 is a schematic diagram showing the region of pixel data necessary for generating an interpolation output b7.
Figure 18:
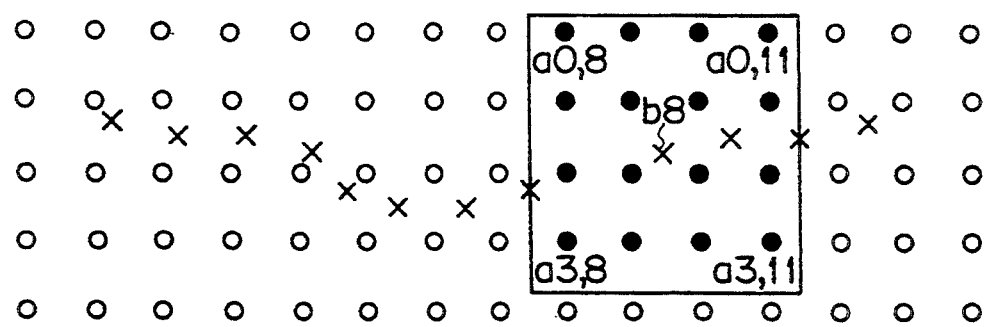
FIG. 18 is a schematic diagram showing the region of pixel data necessary for generating an interpolation output b8.
Figure 19:
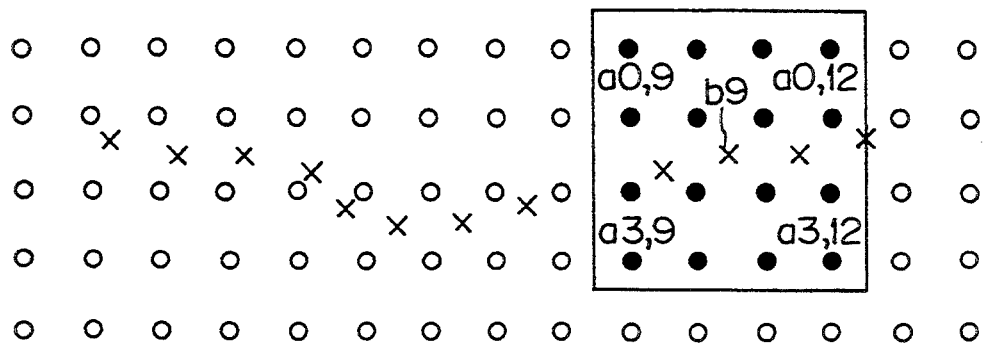
FIG. 19 is a schematic diagram showing the region of pixel data necessary for generating an interpolation output b9.
Figure 20:
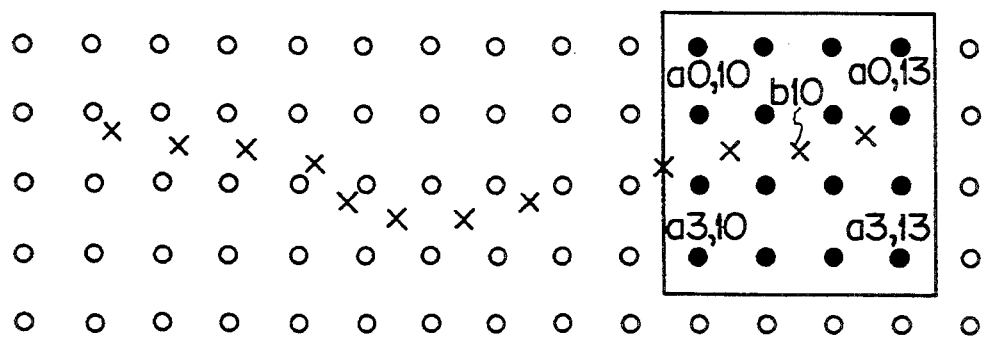
FIG. 20 is a schematic diagram showing the region of pixel data necessary for generating an interpolation output b10.
Figure 21:
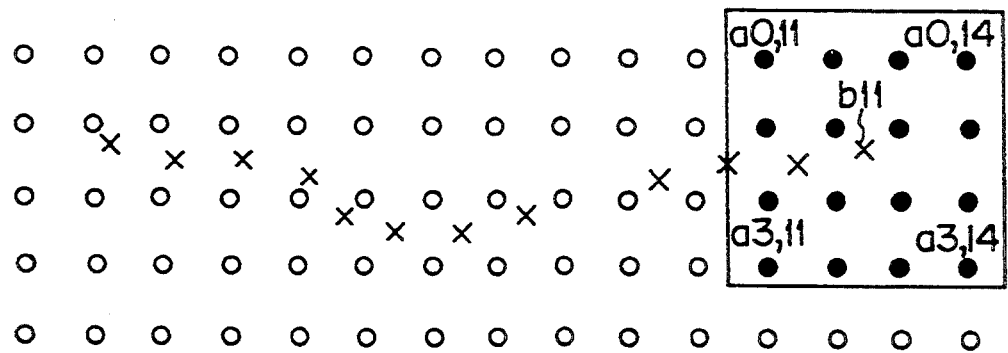
FIG. 21 is a schematic diagram showing the region of pixel data necessary for generating an interpolation output b11.

Next, an operation of the above mentioned embodiment of a digital interpolation apparatus of the present invention will be described. In this operation, a case is considered in which the distortion of a picture photographed through a wide angle lens is compensated by the use of the interpolation operation. FIG. 8 is a schematic diagram showing a part of one picture. In the figure, dots represent original picture data a0,0 to a4,14 stored in the memory array 1. With the (5×15) pixel data, interpolation outputs b0 to b11 are formed and thereby the distortion of the picture is compensated.

The interpolation outputs are sent in the order of b0, b1, ..., and b11. To form each interpolation output, original data ai,j which are present at the adjacent positions thereof are used. The data ai,j necessary for interpolation calculations are data in the range of ±2 pixels about bk (where k=0, 1, 2, ..., and 11) in the horizontal and vertical directions as shown in FIG. 9. Thus, to generate each interpolation output, 16 original pixel data are required.

FIG. 10 shows the range of pixel data necessary for generating the interpolation output b0 in FIG. 8. Likewise, FIGS. 11, 12, 13, 14, 15, 16, 17, 18, 19, 20 and 21 represent the ranges of the pixel data necessary for generating the interpolation outputs b1, b2, b3, ..., and b11, respectively.

Figure 22:
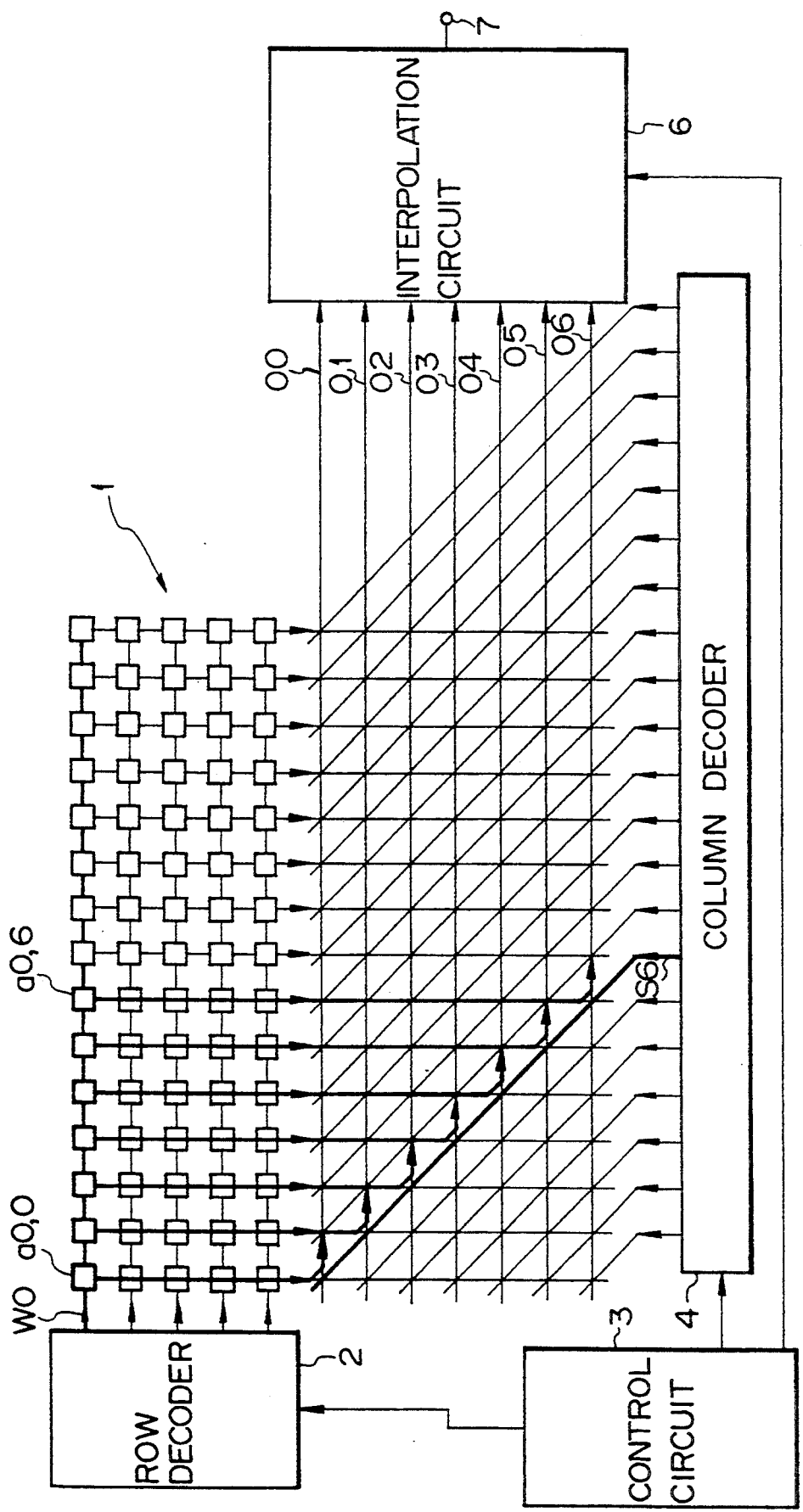
FIG. 22 is a block diagram describing the operation of a first cycle in accordance with an embodiment of the present invention.

An operation where the scheme of the invention shown in FIG. 7 is applied to the above mentioned interpolation process is shown in the figures that follow. FIG. 22 shows the process of a first cycle. In this cycle, the memory cells represented with thick lines are accessed. In other words, when the row decoder 2 designates the word line W0 and the select signal S6 from the column decoder 4 becomes active, the bit lines B0 to B6 are connected to the output lines O0 to O6, respectively. As a result, pixel data a0,0 to a0,6 of the first row stored in the memory array 1 are read and sent to the interpolation circuit 6.

Figure 23:
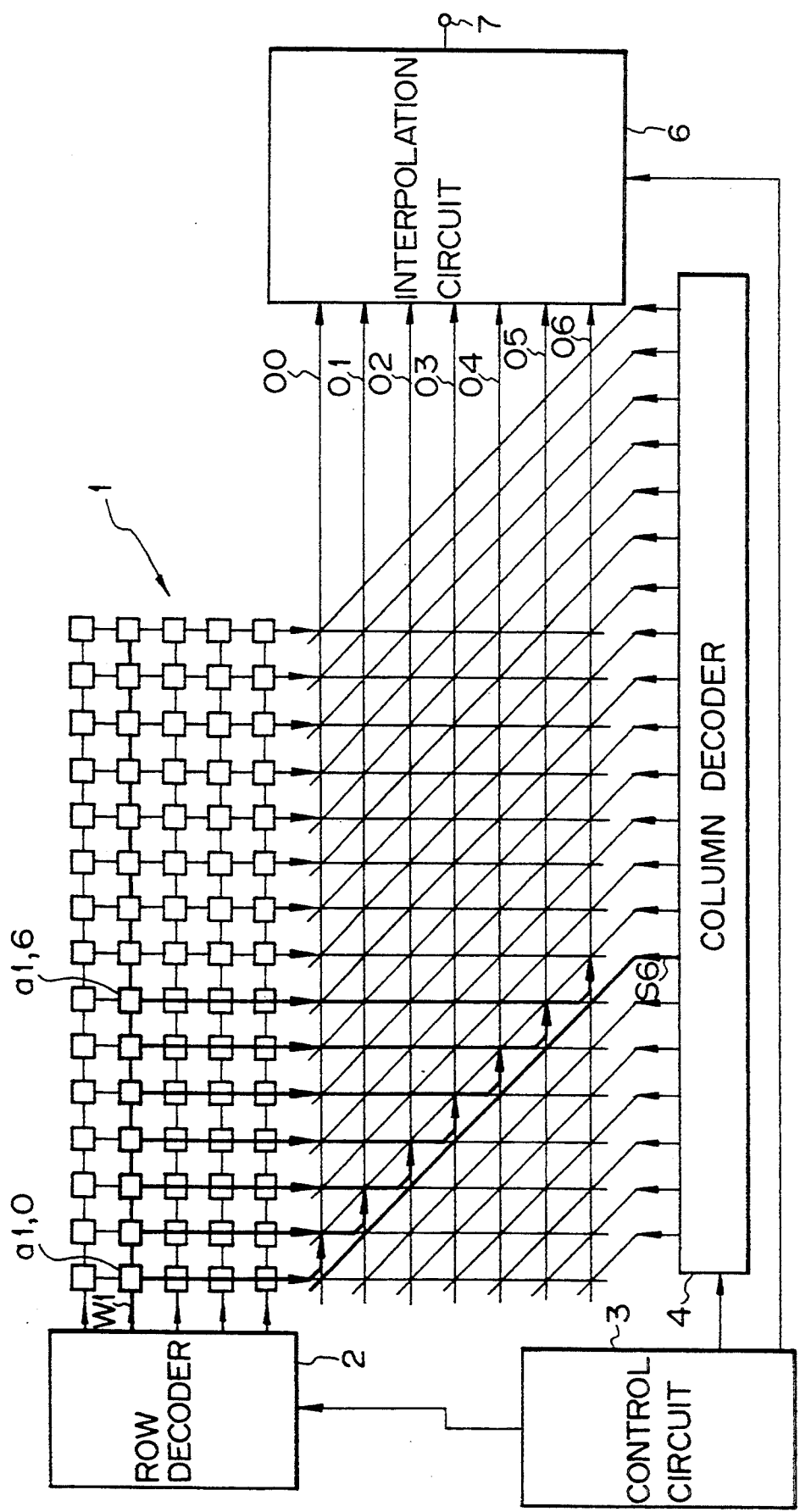
FIG. 23 is a block diagram describing the operation of a second cycle in accordance with an embodiment of the present invention.
Figure 24:
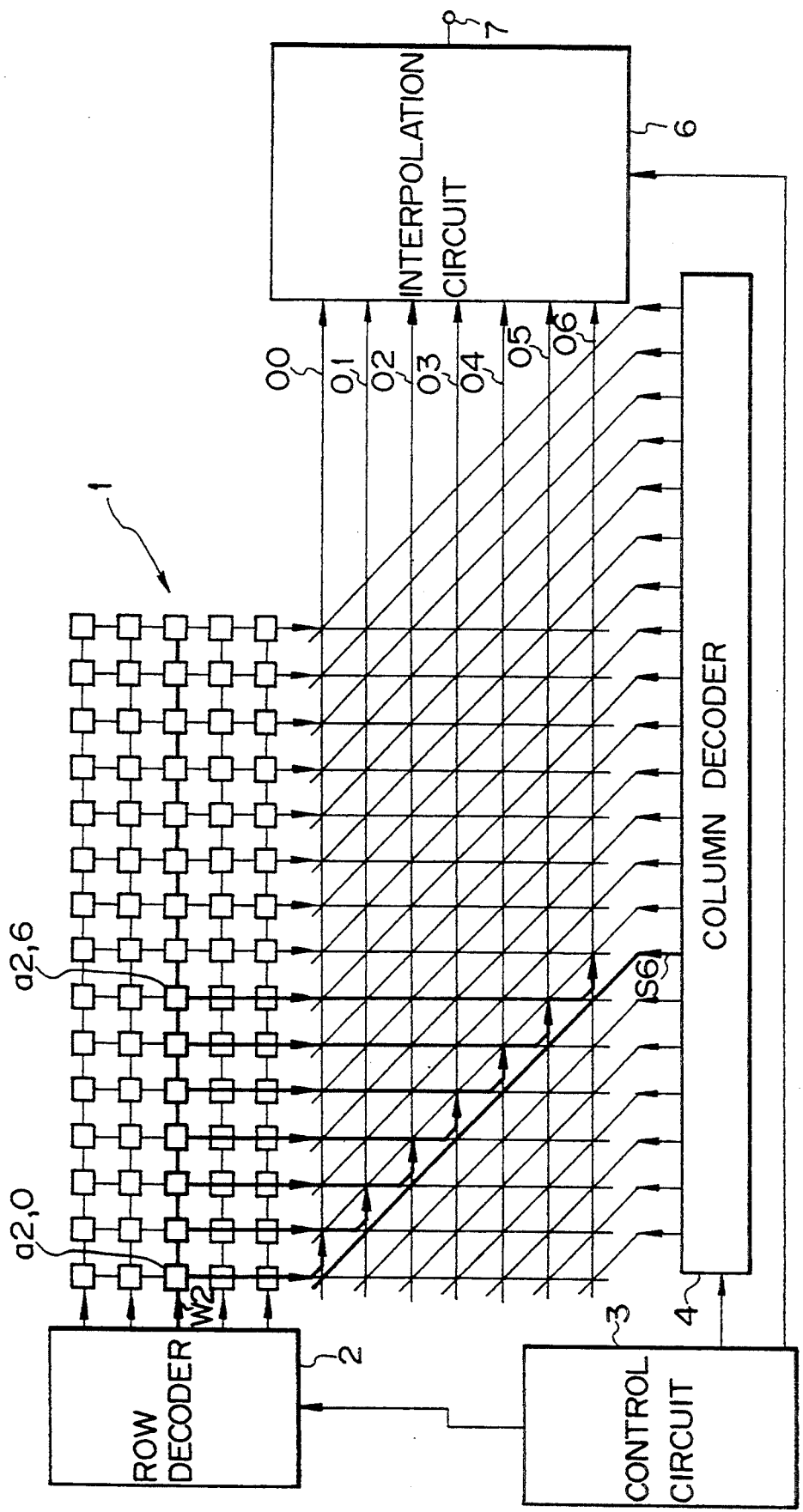
FIG. 24 is a block diagram describing the operation of a third cycle in accordance with an embodiment of the present invention.
Figure 25:
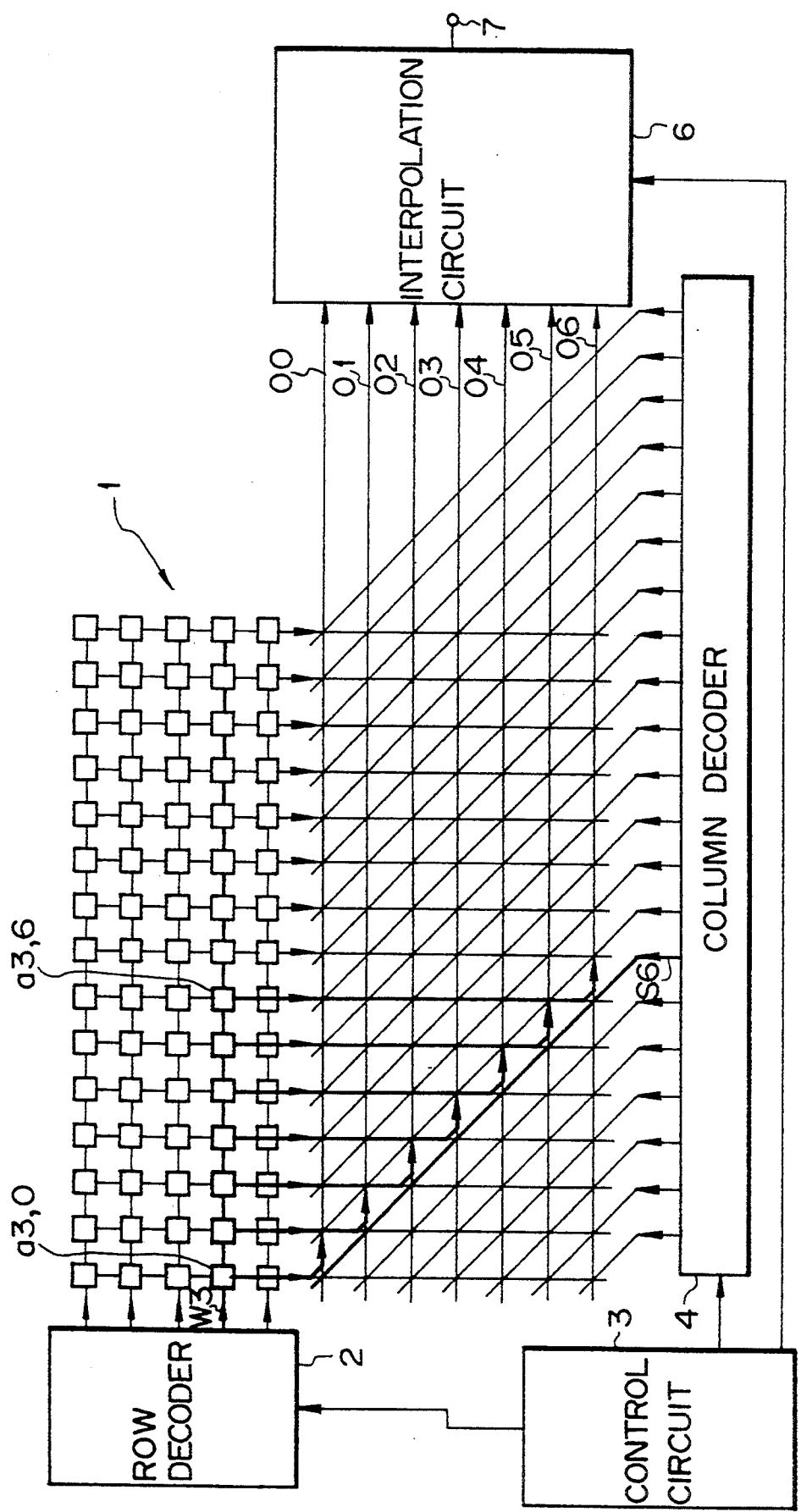
FIG. 25 is a block diagram describing the operation of a fourth cycle in accordance with an embodiment of the present invention.
Figure 26:
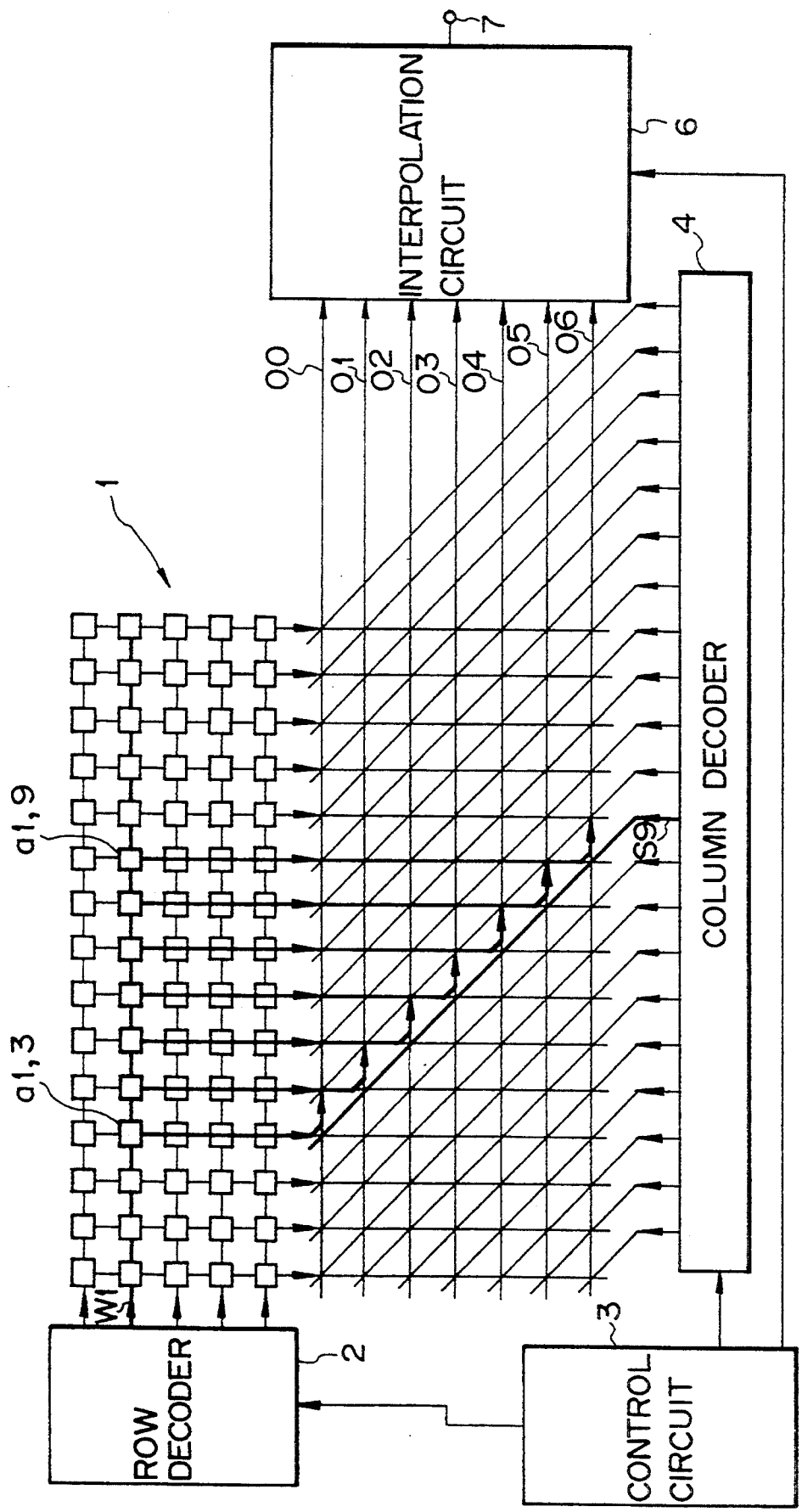
FIG. 26 is a block diagram describing the operation of a fifth cycle in accordance with an embodiment of the present invention.
Figure 27:
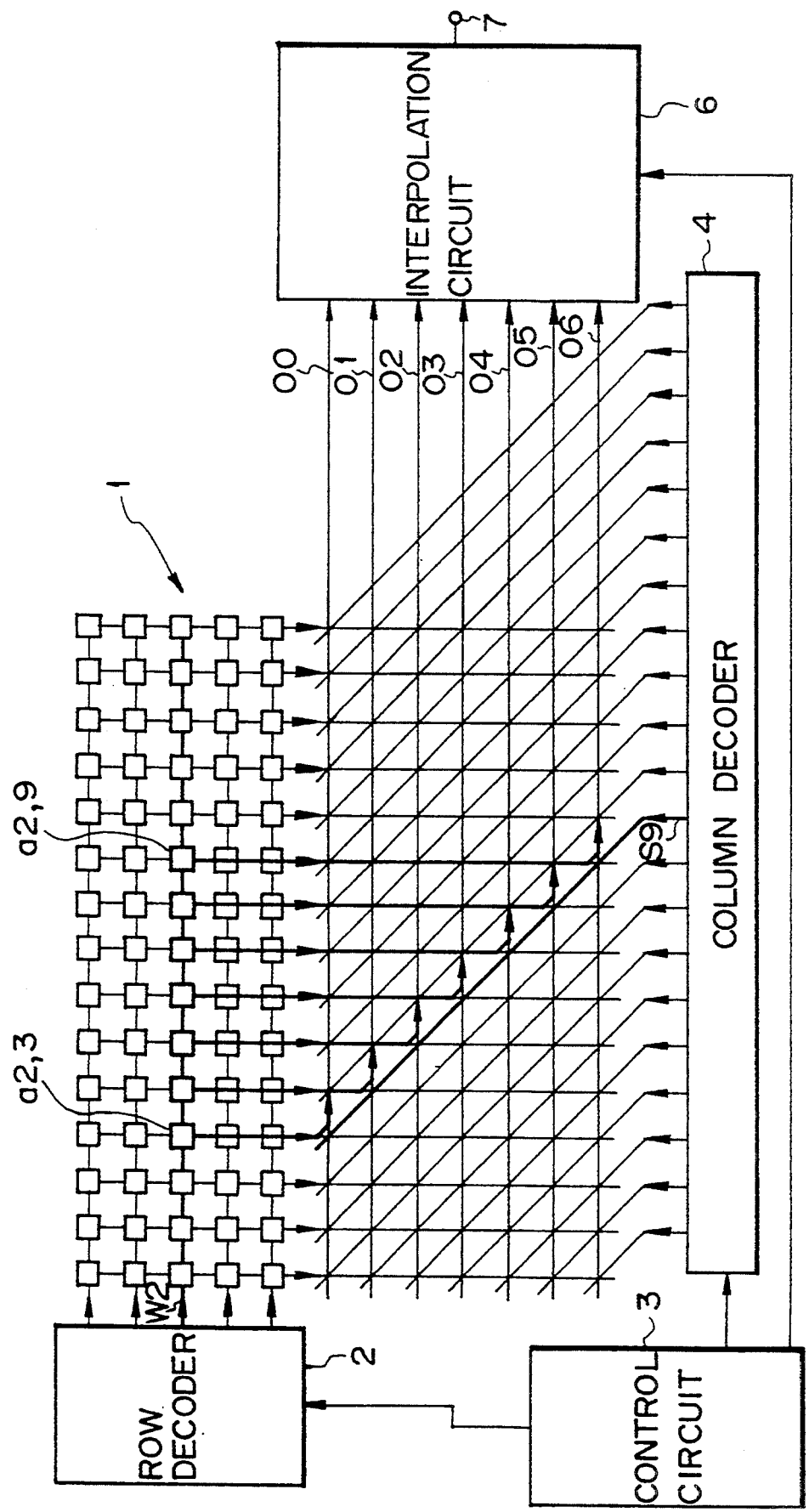
FIG. 27 is a block diagram describing the operation of a sixth cycle in accordance with an embodiment of the present invention.
Figure 28:
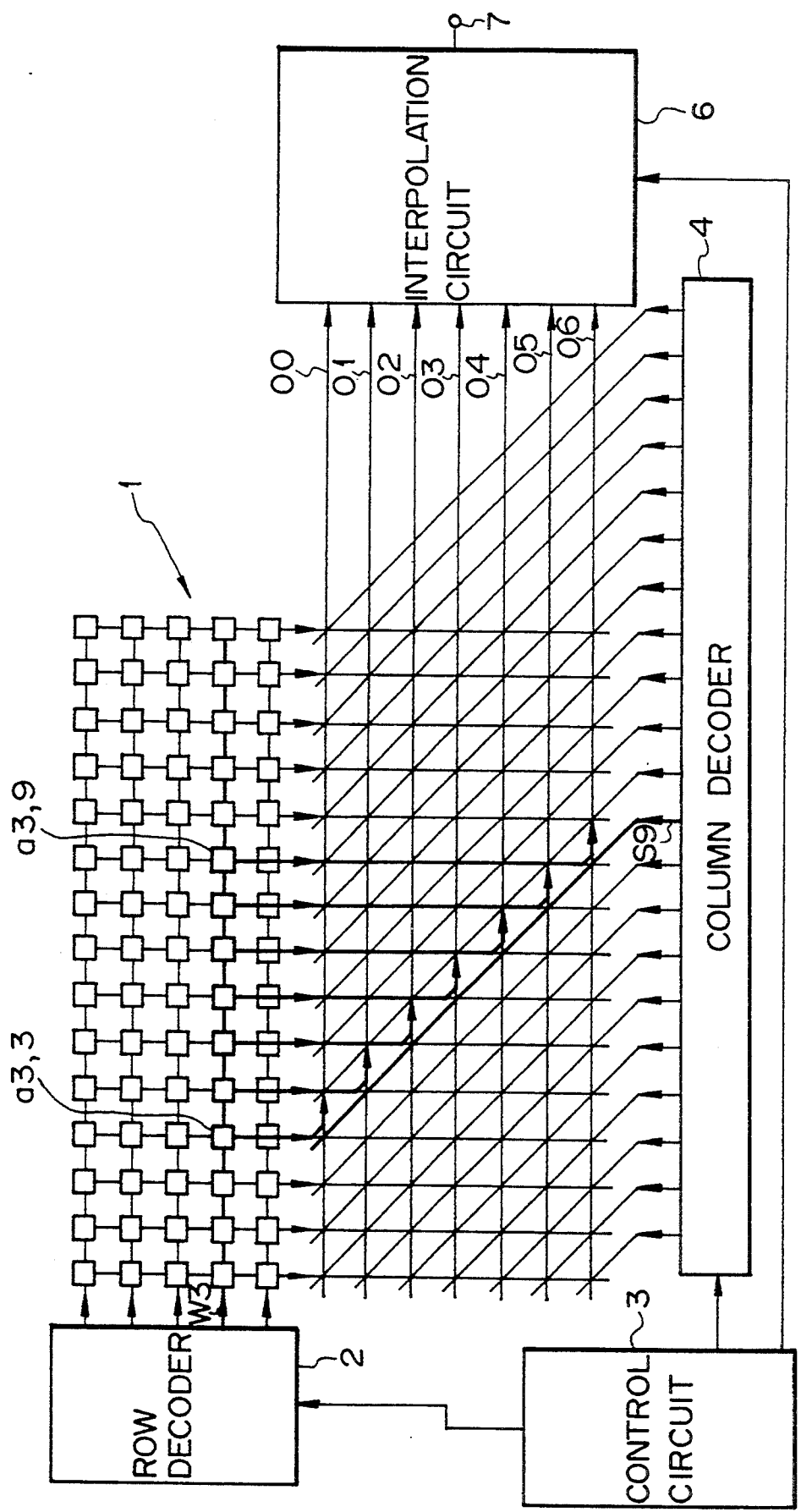
FIG. 28 is a block diagram describing the operation of seventh cycle in accordance with an embodiment of the present invention.
Figure 29:
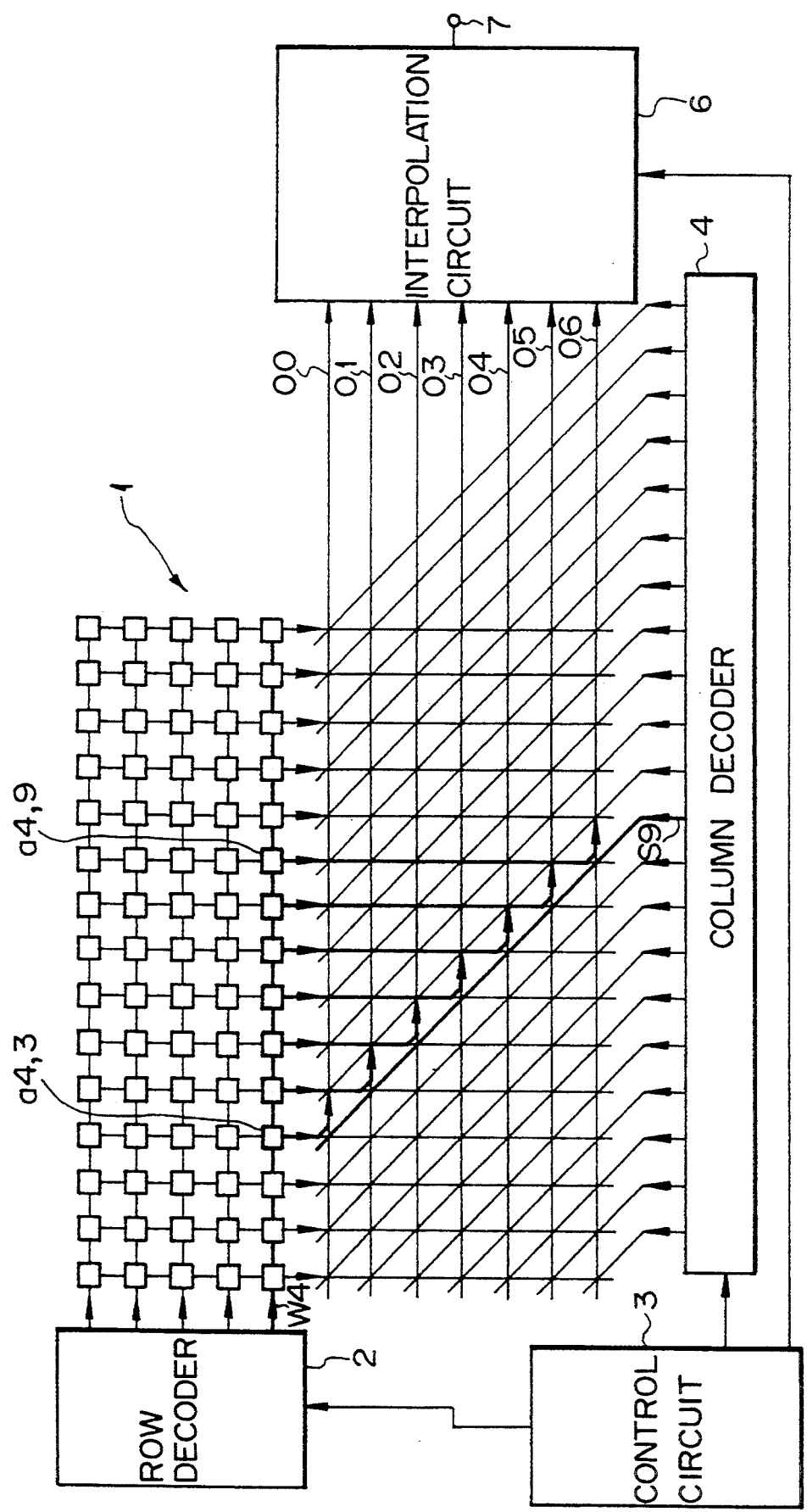
FIG. 29 is a block diagram describing the operation of a eighth cycle in accordance with an embodiment of the present invention.
Figure 30:
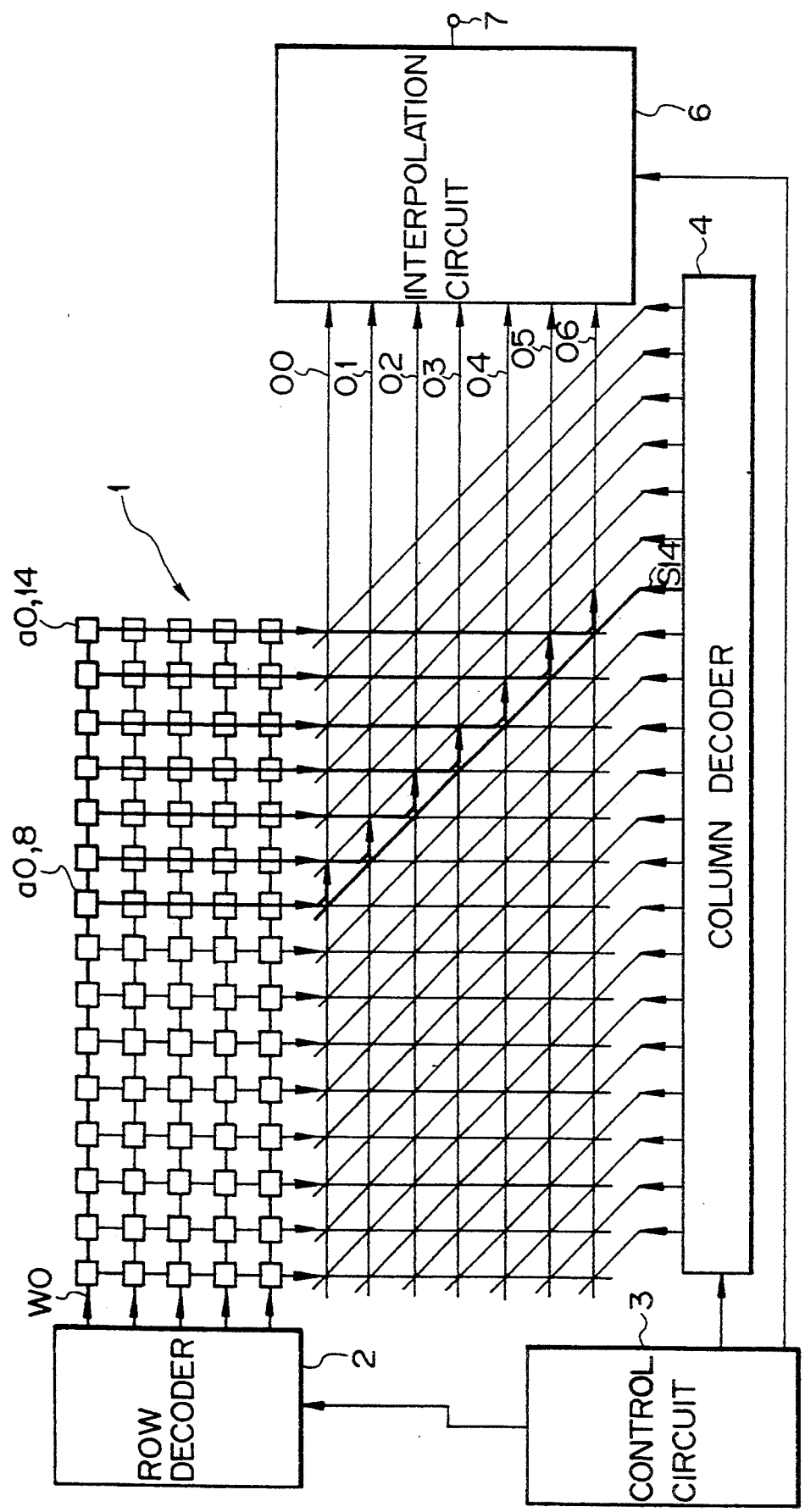
FIG. 30 is a block diagram describing the operation of a ninth cycle in accordance with an embodiment of the present invention.
Figure 31:
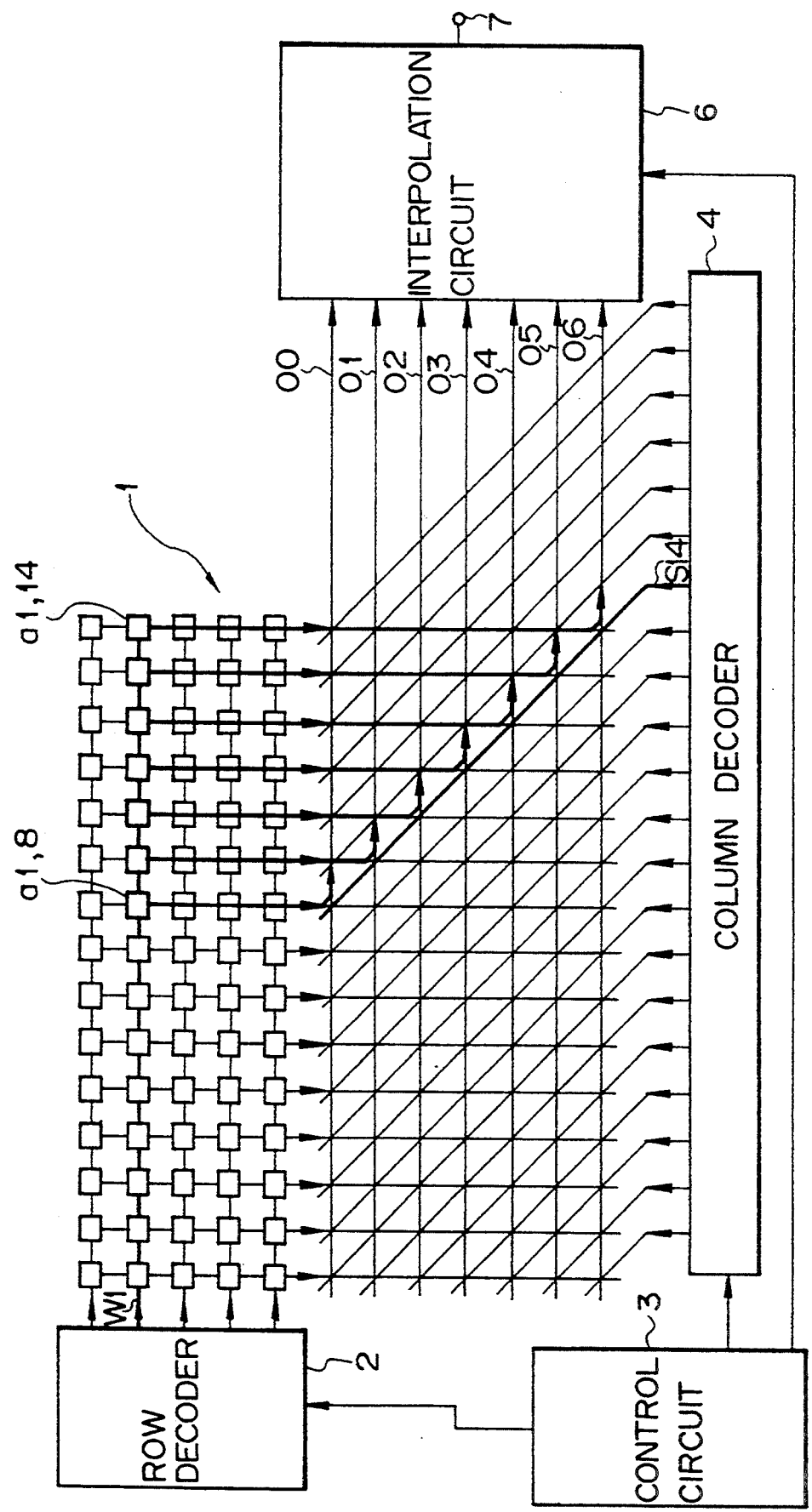
FIG. 31 is a block diagram describing the operation of a tenth cycle in accordance with an embodiment of the present invention.
Figure 32:
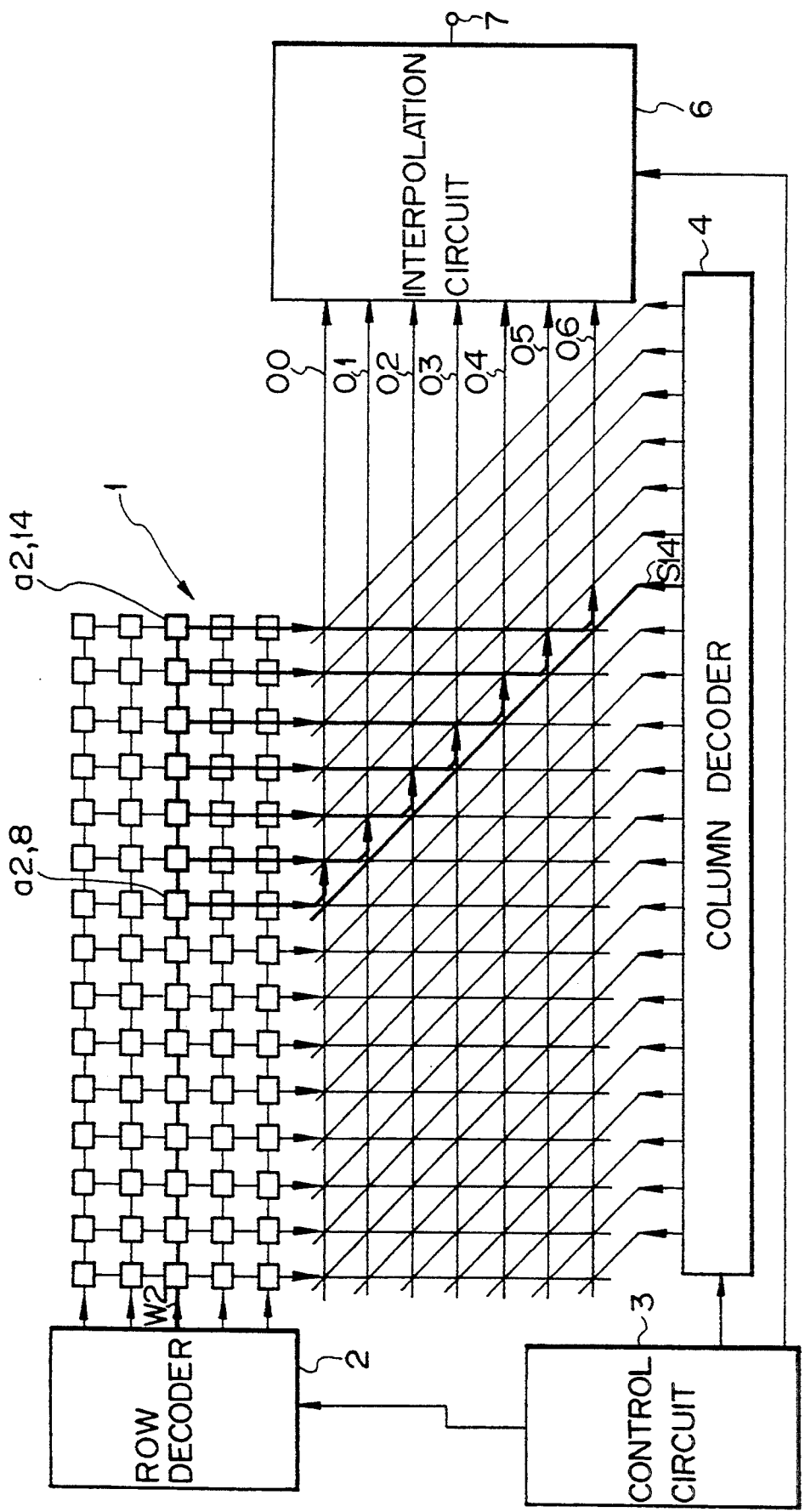
FIG. 32 is a block diagram describing the operation of an eleventh cycle in accordance with an embodiment of the present invention.
Figure 33:
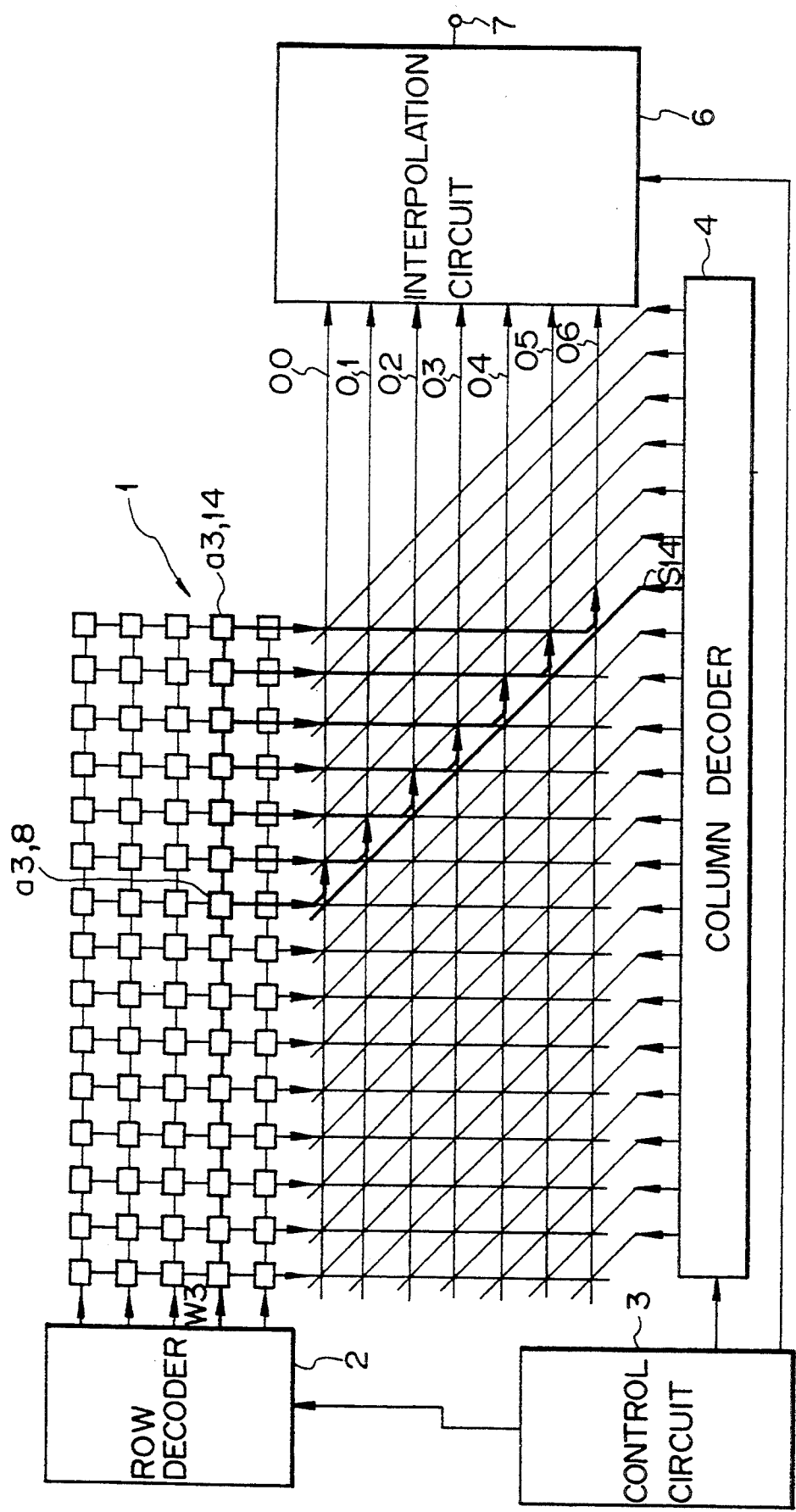
FIG. 33 is a block diagram describing the operation of a twelfth cycle in accordance with an embodiment of the present invention.

In a second cycle that follows the first cycle, as shown in FIG. 23, the word line W1 is designated and the select signal S6 becomes active. Thus, seven pixel data a1,0 to a1,6 of the second row are read from the memory array 1 and sent to the interpolation circuit 6. In a third cycle, as shown in FIG. 24, the word line W2 is designated and the select signal S6 becomes active. Thus, seven pixel data a 2,0 to a2,6 of the third row are read from the memory array 1 and sent to the interpolation circuit 6. In a fourth cycle, as shown in FIG. 25, the word line W3 is designated and the select signal S6 becomes active. Thus, seven pixel data a3,0 to a3,6 of the fourth row are read from the memory array 1 and sent to the interpolation circuit 6.

When the fourth cycle is completed, original pixel data necessary for the interpolation calculations shown in FIGS. 10, 11, 12, and 13 are sent to the interpolation circuit 6. Thus, the interpolation circuit 6 generates the interpolation outputs b0, b1, b2, and b3. In the interpolation calculations, 16 original pixel data are multiplied by respective coefficients and the results are added. These coefficients depend on the relation between interpolation outputs and positions of original pixel data. The interpolation outputs are obtained from an output terminal 7 of the interpolation circuit 6. It should be noted that it is possible to temporarily store the interpolation outputs in memory and output them at a predetermined rate.

FIGS. 26 to 29 show access operations of the memory array 1 from a fifth cycle to an eighth cycle. In these operations, pixel data (a1,3 to a1,9), (a2,3 to a2,9), (a3,3 to a3,9), and (a4,3 to a4,9) which are contained in the second line, the third line, the fourth line, and the fifth line, respectively, are read from the memory array 1. Thus, pixel data necessary for generating the interpolation outputs b4 to b7 shown in FIGS. 14 to 17 are sent to the interpolation circuit 6. When the eighth cycle is completed, these interpolation outputs are generated.

FIGS. 30 to 33 show access operations of the memory array 1 from a ninth cycle to a twelfth cycle. In these operations, pixel data (a0,8 to a0,14), (a1,8 to a1,14), (a2,8 to a2,14), and (a3,8 to a3,14) which are contained in the first line, the second line, the third line, and the fourth line, respectively, are read from the memory array 1. Thus, pixel data necessary for generating interpolation outputs b8 to b11 shown in FIGS. 18 to 21 are sent to the interpolation circuit 6. After the twelfth cycle is completed, these interpolation outputs are generated.

By connecting in parallel one input line to the bit lines led from the memory array 1 and providing another input column decoder besides the column decoder 4, one bit line can be designated so as to write pixel data to the memory array 1.

Figure 34:
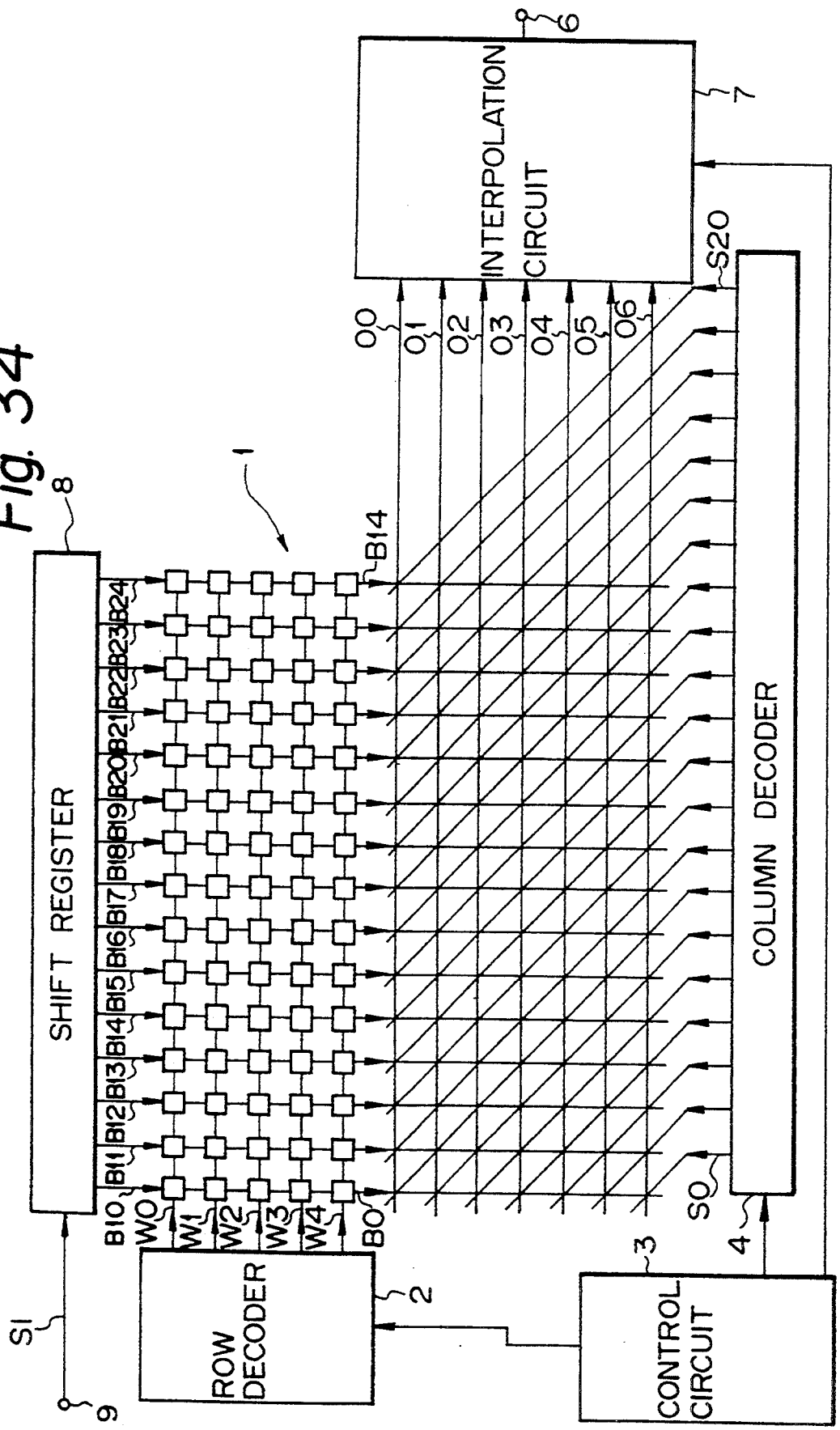
FIG. 34 is a block diagram of second embodiment of a digital interpolation apparatus according to the present invention.

Further, as shown in FIG. 34, it is possible to use a serial input port SI as a construction in accordance with the present invention. In this construction, serial input data from an input terminal 9 (SI) is sent to a shift register 8. Parallel outputs of the shift register 8 are connected to bit lines b10 to b24 of the memory array 1. The fifteen data which are input to the shift register 8 are written to fifteen memory cells connected to the word line designated by the row decoder 2 at the same time.

The above described operations are performed when the interpolation calculations shown in FIGS. 8–33 are performed. Also, it should be noted that interpolation calculations can be also performed for other operations such as enlarging and reducing pictures.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

According to the present invention, a column decoder can be used in common for a plurality of input/output ports. In comparison with the construction where a column decoder is provided for each input/output port, the circuit scale can be decreased. Also, when video signals or audio signals are processed, a plurality of adjacent data is needed at the same time in most cases. Thus, this type of processing can be accomplished without restriction because fewer column decoders may be required.

According to the present invention, a plurality of adjacent pixel data can be sent to the circuit which performs interpolation calculations at the same time by performing a single access of the memory array. Thus, the interpolation process can be performed at a high speed. In addition, since the column decoder can be used in common for a plurality of input/output ports, the circuit scale can be reduced.

What is claimed is:

1. A multi-port memory, comprising:
   a memory array having a plurality of memory cells arranged in a matrix fashion, the memory array including first signal lines for selecting rows of the plurality of memory cells and second signal lines for selecting columns of the plurality of memory cells;
   a first decoder for generating select signals for selecting the first signal lines;
   a plurality of input/output ports connected to the second signal lines; and
   a second decoder for use in common for the plurality of input/output ports and for generating select signals for selecting the second signal lines;
   wherein the select signals select the second signal lines to connect the plurality of input/output ports to the second signal lines, and the second signal lines are shifted one by one.

2. A multi-port memory according to claim 1, wherein a plurality of second decoders are provided and at least one input/output port is provided for each of the second decoders so that each second decoder can select different second signal lines.

3. A multi-port memory according to claim 2, wherein the plurality of second decoders are arranged on more than one side of the memory cells of the memory array so as to sandwich the memory cells of the memory array between the plurality of second decoders.

4. A multi-port memory according to claim 1, wherein a shift register is connected to the second signal lines so as to load data in parallel from a plurality of memory cells on one of the rows of memory cells of the memory array.

5. A multi-port memory according to claim 1, wherein the input/output ports comprise input ports and output ports which are independently constructed and the second decoder comprises an input decoder and an output decoder corresponding to the input ports and the output ports, respectively.

6. A multi-port memory according to claim 1, wherein the input/output ports are constructed as input ports.

7. A multi-port memory according to claim 1, wherein the input/output ports are constructed as output ports.

8. A digital interpolation apparatus, comprising:
   a memory array having a plurality of memory cells arranged in a matrix fashion, the memory array including first signal lines for selecting rows of the plurality of memory cells and second signal lines for selecting columns of the plurality of memory cells;
   a first decoder for generating select signals for selecting the first signal lines;
   a plurality of output ports connected to the second signal lines;
   a second decoder for use in common for the plurality of output ports and for generating select signals for selecting the second signal lines; and
   an interpolation circuit for receiving read data of the memory array from the plurality of output ports;
   wherein select signals select the second signal lines to connect the plurality of output ports to the second signal lines, the second signal lines are shifted one by one, and the interpolation circuit performs interpolation calculations for a plurality of adjacent data supplied from the plurality of output ports so as to generate interpolated output data.

9. A digital interpolation apparatus according to claim 8, wherein a shift register is connected to the second signal lines so as to load data in parallel from a plurality of memory cells on one of the rows of memory cells of the memory array.

10. A digital interpolation apparatus according to claim 8, wherein the memory array stores pixel data.

11. A digital interpolation apparatus according to claim 8, wherein the digital interpolation apparatus is used in a video camera apparatus for performing a motion vector process of the pixel data so as to perform compensation for hand movement for the video camera apparatus.

12. A multi-port memory comprising:
a matrix of memory cells with the memory cells arranged in m rows and n columns where n and m are integers greater than one;
a plurality of m word lines with each word line connecting the memory cells of one row;
a plurality of n bit lines with each bit line connecting the memory cells of one column;
a row decoder connected to the m word lines, where the row decoder selects a row of memory cells for the input or output of data;
a column decoder for selectively supplying a select signal;
a plurality of p input/output lines which can be connected to the bit lines for the input and output of data; and
at least one select line which receives the select signal from the column decoder so that the select line will connect at least two bit lines to at least two input/output lines when the select signal is received.

13. The multi-port memory according to claim 12, wherein data can be input or output to a selected plurality of memory cells of the matrix of memory cells such that the selected plurality of memory cells is comprised of the memory cells which are on a word line selected by the row decoder and which are also connected on the plurality of bit lines which are connected to input/output lines by the select signal.

14. The multi-port memory according to claim 12, wherein each signal line can respectively connect a different plurality of p bit lines to the p input/output lines.

15. The multi-port memory of claim 14, wherein the bit lines are sequentially numbered 1 to n and there are at least $(n-p+1)$ sequentially numbered signal lines such that an i(th) signal line can connect bit lines numbered i to $(i+p-1)$ respectively to the p input/output lines, where i is an integer between 1 and $(n-p+1)$ inclusive.

16. The multi-port memory according to claim 12, further comprising a plurality of switches controlled by the select signal for selectively connecting the bit lines to the input/output lines.

17. The multi-port memory of claim 12, further comprising an interpolation circuit which receives data from the matrix of memory cells through the input/output lines and calculates interpolated values based on the received data.

* * * * *